(12) United States Patent
Markiewicz et al.

(10) Patent No.: US 11,309,530 B2
(45) Date of Patent: Apr. 19, 2022

(54) ADDITIVE MANUFACTURED ELECTRODE FOR FLOW BATTERY

(71) Applicant: Concurrent Technologies Corporation, Johnstown, PA (US)

(72) Inventors: Daniel R. Markiewicz, Johnstown, PA (US); Michel J. McCluskey, Somerset, PA (US); Timothy Allen Kennedy, Home, PA (US); Paul John Brezovec, Johnstown, PA (US); Michael L. Tims, Hollsopple, PA (US)

(73) Assignee: Concurrent Technologies Corporation, Johnstown, PA (US)

( * ) Notice: Subject to any disclaimer, the term of this patent is extended or adjusted under 35 U.S.C. 154(b) by 204 days.

(21) Appl. No.: 15/869,676

(22) Filed: Jan. 12, 2018

(65) Prior Publication Data
US 2018/0205067 A1    Jul. 19, 2018

Related U.S. Application Data

(60) Provisional application No. 62/445,944, filed on Jan. 13, 2017.

(51) Int. Cl.
*H01M 8/0258* (2016.01)
*H01M 8/0247* (2016.01)
*H01M 8/04276* (2016.01)
*H01M 4/04* (2006.01)
*H01L 31/0224* (2006.01)
*H01M 4/587* (2010.01)
(Continued)

(52) U.S. Cl.
CPC .. *H01M 4/0404* (2013.01); *H01L 31/022433* (2013.01); *H01M 4/13* (2013.01); *H01M 4/587* (2013.01); *H01M 4/62* (2013.01); *H01M 4/662* (2013.01); *H01M 4/663* (2013.01); *H01M 8/0234* (2013.01); *H01M 8/0245* (2013.01); *H01M 8/0258* (2013.01); *H01M 8/0263* (2013.01); *H01M 8/04283* (2013.01); *H01M 8/188* (2013.01); *H01M 10/0525* (2013.01); *H01M 8/0213* (2013.01); *H01M 8/0228* (2013.01); *Y02E 60/50* (2013.01)

(58) Field of Classification Search
None
See application file for complete search history.

(56) References Cited

U.S. PATENT DOCUMENTS 9,184,454 B1 * 11/2015 Peace ............... H01M 8/188
10,673,078 B2 * 6/2020 Byun ................ H01M 8/0258
(Continued)

*Primary Examiner* — Tracy M Dove
(74) *Attorney, Agent, or Firm* — Buchanan Ingersoll & Rooney PC

(57) ABSTRACT

The current invention includes an additive manufactured electrode that may be used for a flow battery system. In some embodiments, the electrode may include a composite material and/or at least one flow channel to direct, or at least influence, flow of electrolyte. The flow channel can be formed onto a surface and/or within a body of the electrode, and may be used to generate fluid pathways that cause the electrolyte to flow in a certain manner. The composite material may include a rigid core and a flexible compressible outer layer that may improve reactions zones, enhance mechanical properties, and/or provide low-pressure paths for electrolyte to flow.

15 Claims, 30 Drawing Sheets
(16 of 30 Drawing Sheet(s) Filed in Color)

(51) Int. Cl.
*H01M 4/62* (2006.01)
*H01M 4/13* (2010.01)
*H01M 4/66* (2006.01)
*H01M 10/0525* (2010.01)
*H01M 8/0263* (2016.01)
*H01M 8/0234* (2016.01)
*H01M 8/18* (2006.01)
*H01M 8/0245* (2016.01)
*H01M 8/0213* (2016.01)
*H01M 8/0228* (2016.01)

(56) References Cited

U.S. PATENT DOCUMENTS

| | | | |
|---|---|---|---|
| 2012/0244395 A1* | 9/2012 | Perry | H01M 8/0265 |
| | | | 429/51 |
| 2014/0065460 A1* | 3/2014 | Evans | H01M 8/20 |
| | | | 429/101 |
| 2014/0255746 A1* | 9/2014 | Sinsabaugh | H01M 8/0228 |
| | | | 429/105 |
| 2015/0263358 A1* | 9/2015 | Zaffou | H01M 8/188 |
| | | | 429/51 |

* cited by examiner

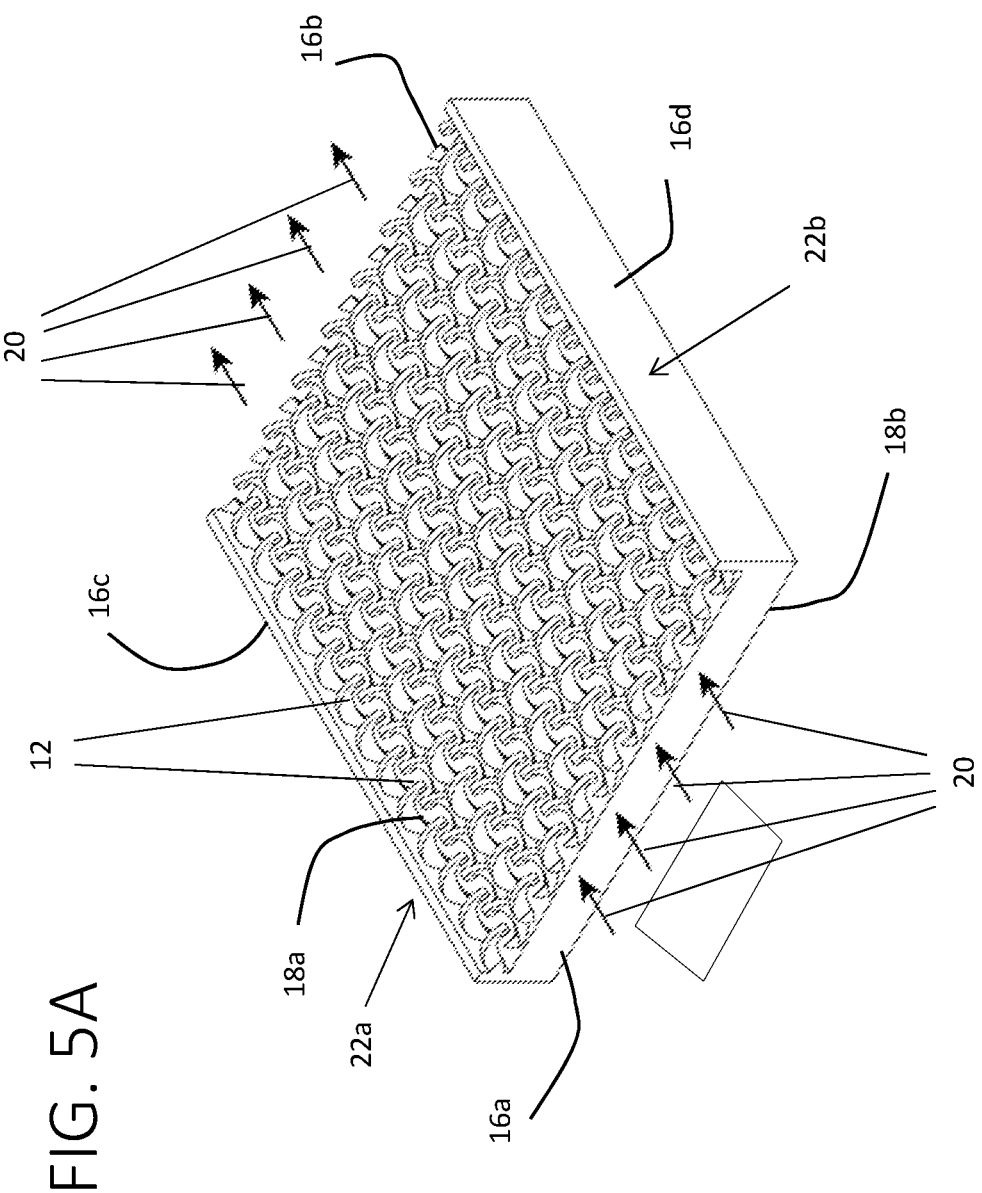

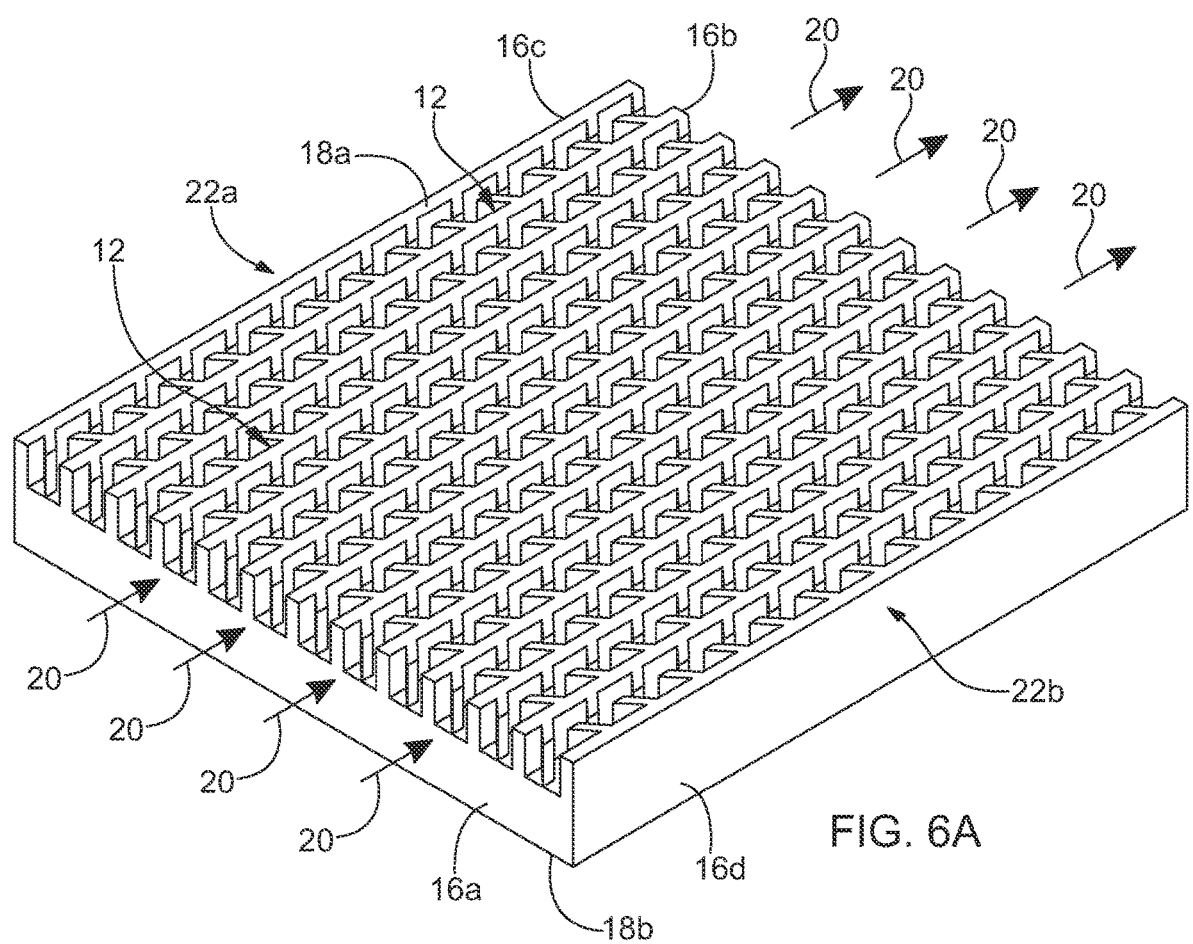

ADDITIVE MANUFACTURED ELECTRODE FOR FLOW BATTERY

CROSS-REFERENCE TO RELATED APPLICATIONS

This patent application is related to and claims the benefit of priority to U.S. Provisional Patent Application No. 62/445,944, filed on Jan. 13, 2017, the entire contents of which are incorporated herein by reference.

FIELD OF THE INVENTION

Embodiments of the present invention can include an additive manufactured electrode having a composite material and/or at least one flow channel to direct, or at least influence, how electrolyte interacts with the electrode.

BACKGROUND OF THE INVENTION

A flow battery system can include use of fluids containing electroactive elements (e.g., electrolytes) to convert chemical energy to electrical energy. Some systems can include electrolyte tanks to store the electrolytes (e.g., a catholyte fluid and an anolyte fluid) so that they can be directed into one or more electrochemical cells such that the electrolytes come into contact with electrodes to generate electrical energy. The electrical energy may then be transferred to current collectors of the flow battery system.

Electrochemical cells generally have a framework to house the various components of the electrochemical cell and to form an electrode chamber. The electrode chamber can be situated within a flow compartment configured to allow the electrolytes to flow there-through as they are directed into, and out from, the electrochemical cell. Prior art electrodes consist of standard electrical conductor materials that may allow for the transfer of electrons or other charged particles to and from the electrolytes. The electrodes of the prior art fail to provide a means to maximize, or at least influence, flow characteristics of the electrolytes. The prior art further fails to maximize the amount and/or the rate of transfer of electrons or other charged particles.

The present invention is directed toward overcoming one or more of the above-identified problems.

SUMMARY OF THE INVENTION

Performance of some flow battery systems can be related to internal resistance and current transfer efficiency. These two measures of performance may be influenced by the flow of electrolytes through an electrochemical cell and/or the contact with which the electrolytes make with an electrode of the electrochemical cell. In particular, charged particles and/or electrical charge transferring from the electrolyte to the electrode and from the electrode to a current collector of the electrochemical cell can be influenced by the manner in which the electrolytes make contact with the electrode and/or the manner in which the electrolytes flow over and/or through the electrode. The various embodiments of the present invention can include electrode material compositions and/or structural configurations, which may be used to influence the manner in which electrolyte makes contact with, flows over, and/or flows through the electrode. Thus, embodiments of the present invention can include an electrode that may be configured to direct and/or influence the way in which electrolyte interacts with the electrode.

For example, the electrode can be configured as a composite electrode material such that it may increase a time period with which an electrolyte fluid contacts the electrode (i.e., contact-time). In addition, or in the alternative, the electrode can be configured as a composite electrode material such that it may increase a surface area with which the electrode can make contact with a given volume of electrolyte resting on, passing over, and/or passing through the electrode (i.e., surface-contact). In addition, or in the alternative, the electrode can be structured to include at least one flow channel such that it may increase contact-time. In addition, or in the alternative, the electrode can be structured to include at least one flow channel such that it may increase surface-contact. Increasing the contact-time and/or surface-contact may facilitate an increase in amount of electrical charge and/or an increase in a rate of electrical charge from the electrolyte to the electrode. In some embodiments, increasing contact-time and/or surface-contact may be used to increase the coulombic efficiency of a flow battery system that includes an embodiment of the electrode. The coulombic efficiency can be defined as the efficiency with which electric charge can be transferred. The efficiency may be measured by an amount of electric charge transferred, a rate at which electric charge can be transferred, and/or an amount of energy input as a ratio of energy output to achieve a desired level of electric charge or rate of electric charge.

Any of the composite material compositions and/or the flow channel configurations can influence the flow characteristics of the electrolyte in other ways. For example, electrolyte flow patterns can be formed that may improve coulombic efficiency. This may include causing turbulent flow patterns, chaotic flow patterns, periodic flow patterns, crossing flow patterns, etc. Some flow patterns and/or material compositions can change the mixing behavior of electrolyte.

The electrode is contemplated for use in a flow battery system, which may include multiple electrochemical cells and/or cell stacks having more than one electrode. It is further contemplated for the electrode to be used in conjunction with liquid electrolytes, which may include at least one catholyte fluid and at least one anolyte fluid. Thus, it should be understood that reference to a single electrode can be equally applicable to a plurality of electrodes. Reference to an electrolyte can include a fluid electrolyte, which may also include a catholyte fluid and/or an anolyte fluid.

While the presently disclosed device is contemplated for use as an electrode, it is certainly not limited to such use. For example, the device and methods of use can be applicable to any solid element that has a fluid or fluid-like material making contact with it and for which some type of transfer between the fluid and the solid element is desired. The transfer may be heat transfer, where the device may be a heat sink or a component of a heat exchanger, or a chemical diffusion device for purification of a liquid, or a catalyst for improvement of a chemical reaction within the fluid, for example. The disclosed device and its methods of use can be any body for use as a transport medium where the kinetics, thermodynamics, fluid-dynamics, and/or chemical potential interactions between a fluid and a solid element is to be induced and/or controlled.

In an exemplary embodiment, a body as a transport medium can include a member having a first surface and a second surface, where the member is configured for use as a transport medium between a fluid and another object. The body can further include at least one flow channel formed on the first surface, the second surface, and/or within a portion of the member. The at least one flow channel may generate a fluid pathway by which the fluid making contact with the member can be caused to follow. In some embodiments, the fluid contacting the member may include resting against, passing over, and/or passing through the member. In some embodiments, the at least one flow channel may increase contact-time with which the fluid makes when contacting the member. In some embodiments, the at least one flow channel may increase surface-contact with which the fluid makes when contacting the member. In some embodiments, the at least one fluid pathway can cause mixing of the fluid through turbulence, cross flow, or other forms of mixing within the fluid as it passes over and/or passes through the member. In some embodiments, the fluid can be electrolyte. In some embodiments, the member may be configured to allow electrical charge and/or charged particles to transfer from the electrolyte, through the member and to the object. In some embodiments, the member can be made via additive manufacturing techniques. In some embodiments, the at least one flow channel can include a shape that is helical, serpentine, X-cross, and/or post-type. In some embodiments, the fluid pathway can be a helical path, a serpentine path, and/or an X-cross path.

In another exemplary embodiment, a body as a transport medium can include a member having a rigid core and a flexible, compressible outer shell, wherein the member can be configured for use as a transport medium between a fluid and another object. In some embodiments, the rigid core can be carbon foam and the outer shell can be carbon felt. In some embodiments, at least the rigid core may be fabricated via additive manufacturing techniques. In some embodiments, the rigid core can have a first surface and a second surface, and at least one flow channel may be formed on the first surface, the second surface, and/or within a portion of the rigid core. In some embodiments, the at least one flow channel can generate a fluid pathway by which the fluid making contact with the rigid core can be caused to follow. In some embodiments, the at least one flow channel can increase contact-time with which the fluid makes when contacting the member, increase surface-contact with which the fluid makes when contacting the member, and/or cause mixing within the fluid as it passes over and/or passes through the rigid core. In some embodiments, the fluid is electrolyte.

In another exemplary embodiment, an electrode can include an electrode body having a rigid core having at least one flow channel formed on a surface thereof and/or within a portion of the rigid core. The electrode body can further include an outer shell deposited on at least a portion of the rigid core. The rigid core may be configured to provide a low-pressure path to supply electrolyte to the outer shell. The outer shell may be configured to provide a reaction zone for the electrode body. The at least one flow channel can generate a fluid pathway by which the electrolyte making contact with the rigid core can be caused to follow. In some embodiments, at least the rigid core can be fabricated via additive manufacturing techniques. In some embodiments, an electrochemical cell can be formed that includes at least one electrode described herein.

In another exemplary embodiment, a bipolar plate can include a first side and a second side with at least one electrode described herein formed on the first side and/or second side, wherein the bipolar plate and the at least one electrode can be formed as a unitary member. In some embodiments, the unitary member can be formed via additive manufacturing techniques. In some embodiments, the bipolar plate can be configured to be part of an electrochemical cell stack. In some embodiments, the bipolar plate can have a first electrode formed on the first side and a second electrode formed on the second side. In some embodiments, the first electrode may be configured as a negative electrode. The second electrode may be configured as a positive electrode.

While these potential advantages are made possible by technical solutions offered herein, they are not required to be achieved. The presently disclosed device and methods of use can be implemented to achieve technical advantages, whether or not these potential advantages, individually or in combination, are sought or achieved.

Further features, aspects, objects, advantages, and possible applications of the present invention will become apparent from a study of the exemplary embodiments and examples described below, in combination with the figures, and the appended claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other objects, aspects, features, advantages, and possible applications of the present invention will be more apparent from the following more particular description thereof, presented in conjunction with the following figures, in which:

FIG. 5A shows an exemplary of a flow channel configuration for an electrode body in which each flow channel can be formed as a helix.

FIG. 6A shows an exemplary of a flow channel configuration for an electrode body in which each flow channel can be formed as a serpentine.

FIG. 14A shows a single electrochemical cell configuration and FIG. 14B shows a multiple electrochemical cell configuration.

DETAILED DESCRIPTION OF THE INVENTION

Figure 1A:
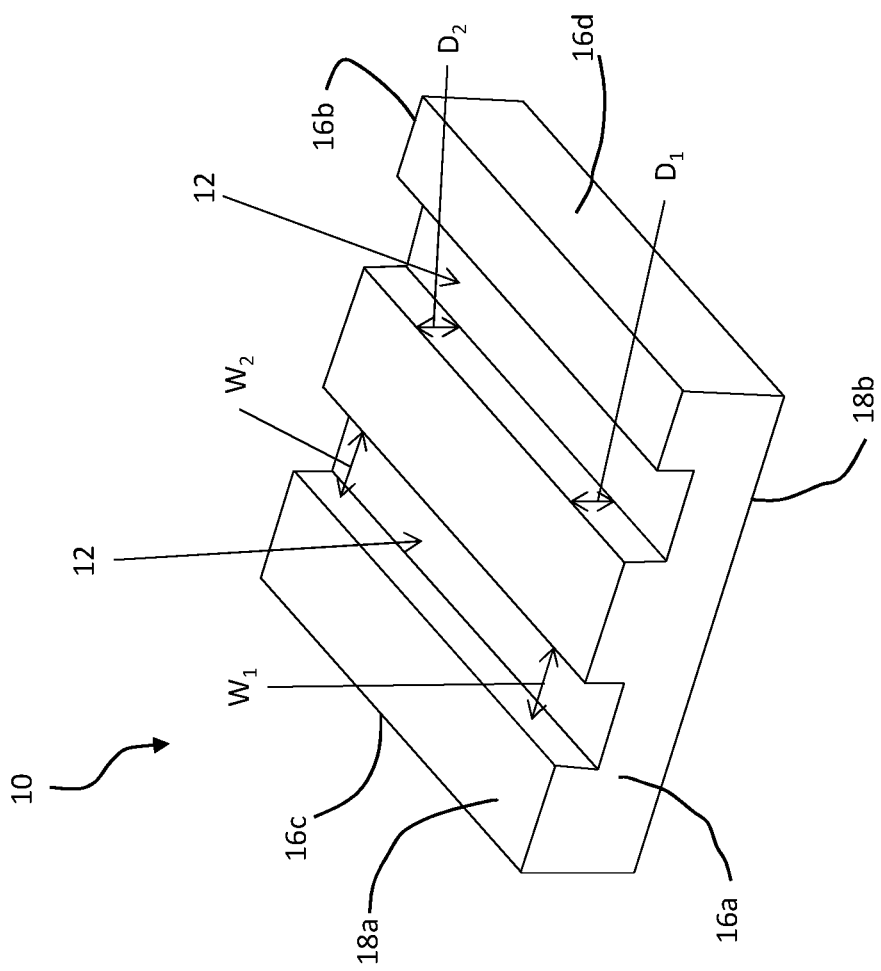
FIG. 1A is a perspective view of an embodiment of an exemplary body that may be used as a transport medium.
Figure 1B:
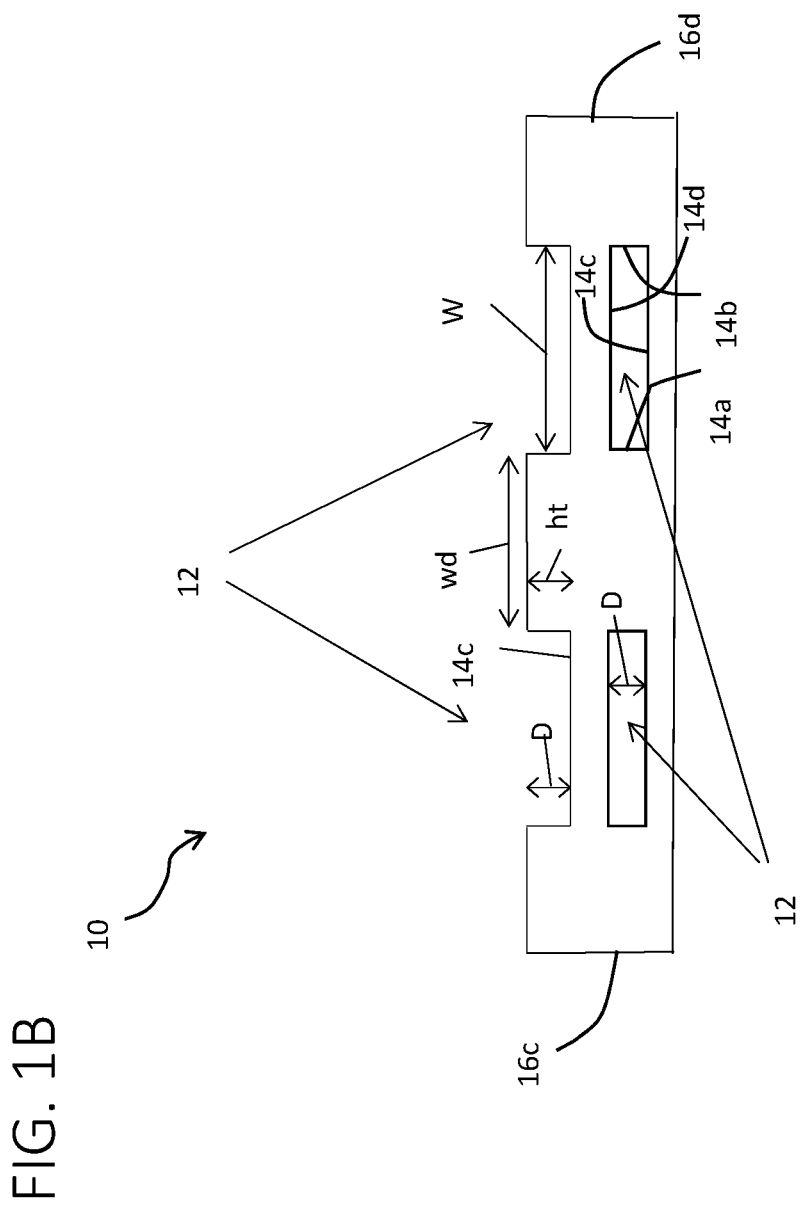
FIG. 1B is a front view of an embodiment of an exemplary body that may be used as a transport medium.
Figure 2A:
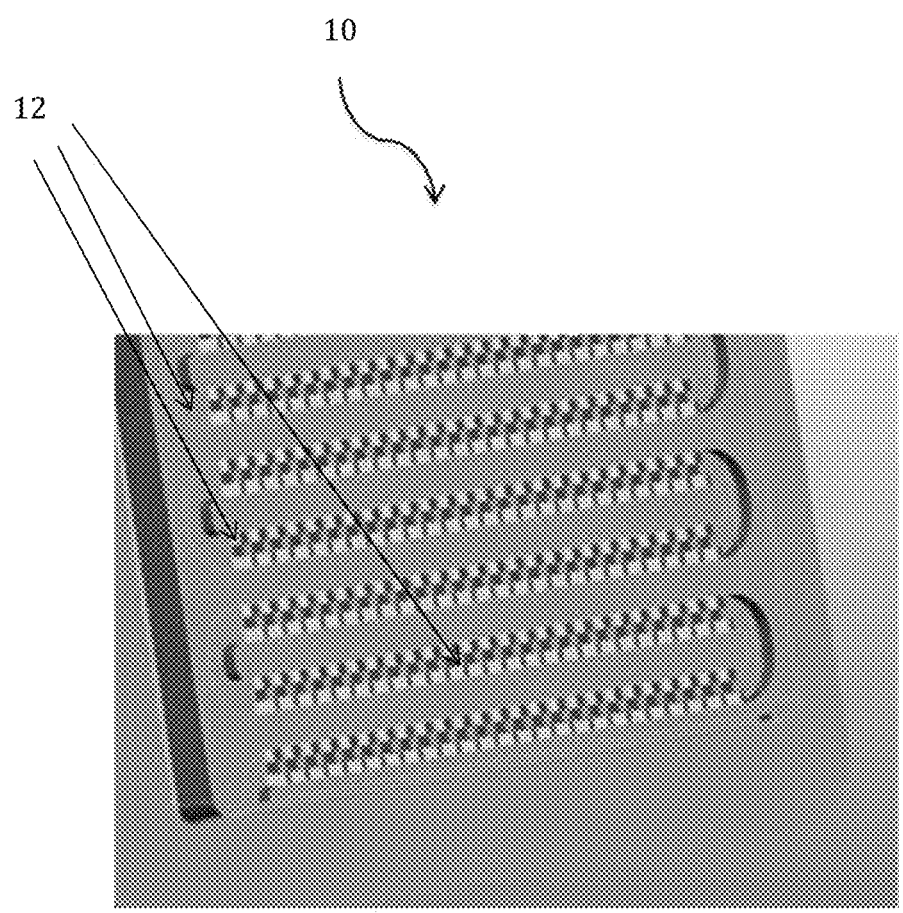
FIG. 2A shows an embodiment of the body for a transport medium having an exemplary single flow channel.
Figure 2B:
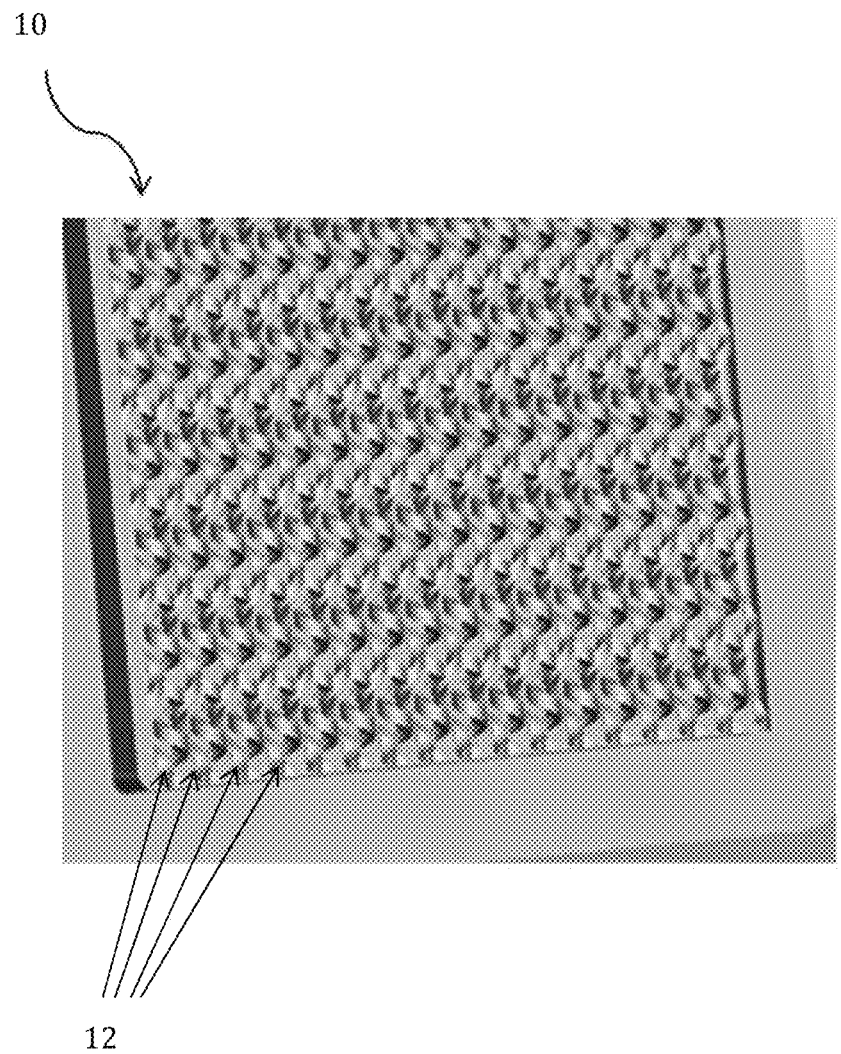
FIG. 2B shows an embodiment of the body for a transport medium having a plurality of exemplary flow channels.

The following description is of an embodiment(s) presently contemplated for carrying out the present invention. This description is not to be taken in a limiting sense, but is made merely for the purpose of describing the general principles and features of the present invention. The scope of the present invention should be determined with reference to the claims.

Referring to FIGS. 1A-2B, in an exemplary embodiment, the device can include a body 10 with at least one flow channel 12. The body 10 can be a structure configured to influence flow of a fluid 11 that may be caused to come into contact with the body 10 and/or influence how the fluid 11 interacts with the body 10. For example, the body 10 can be structured as a heat sink, an electrode, a membrane, a filter, a heat-transfer element, a baffle, a catalyst, etc. The body 10 can be formed into any number of shapes, which may include a square shape, cylindrical shape, triangular shape, hexagonal shape, etc. While the embodiment(s) described herein illustrate planar surfaces, it will be understood by one skilled in the art that any surface of the body 10 can be planar, non-planar, angled, curved, undulated, etc. While exemplary embodiments disclosed herein may show the surface of body 10 as being planar, the surface of the body 10 can take any shape and is therefore not limited to a planar shape. The body 10 can be metal, plastic, composite material, foam, felt, a solid material, a reticulated material, etc. The body 10 may be constructed of a porous material, non-porous material, semi-porous material, etc. The body 10 can be a conductor (e.g., electrical and/or heat), an insulator (e.g., electrical and/or heat), a magnetic material, a non-magnetic material, etc.

The flow channel 12 can be formed within the body 10 and/or on a surface of the body 10. The flow channel 12 can be straight, curved, angled, sinusoidal, serpentine, zig-zagged, herringbone, circular, spiraling, etc. The flow channel 12 can exhibit any length, width, and/or depth. The flow channel 12 can exhibit a varying width and/or depth. For example, any portion of the flow channel 12 can have a width, $W_1$, that is different from a width, $W_2$, at another portion of the flow channel 12. As another example, any portion of the flow channel 12 can have a depth, $D_1$, that is different from a depth, $D_2$, at another portion of the flow channel 12. The flow channel 12 can have the same profile throughout its length or have a varying profile, wherein profile is the shape of the channel 12. For example, a portion of the flow channel 12 can have a square profile while another portion can have a semi-circular profile. Any portion of the flow channel 12 can be smooth, undulated, exhibit a ramp or slope, have a stepped surface, have protrusions, etc. Such surface features can be used to generate a desired flow for the fluid 11 within the flow channel 12. For example, some features can be formed to act as a "snow fence," which may be used to cause fluid 11 to flow in a certain way and/or accumulate at a certain point. Some surface features may be used to cause mixing in the flow of fluid 11.

The flow channel 12 can include a sidewall 14a, 14b. For example, the flow channel 12 can be a square shaped channel having a first flat sidewall 14a and a second flat sidewall 14b forming the square channel 12. As another example, the flow channel 12 can be a semi-circular shape having a first curved sectant sidewall 14a and a second curved sectant sidewall 14b. As another example, the flow channel 12 can be a helical shape having a first helix sidewall 14a and a second helix sidewall 14b forming the helical channel. The flow channel 12 can have a bottom wall 14c. The bottom wall 14c can be an upper surface of the body 10 if the flow channel 12 is formed on the surface of the body 10. The bottom wall 14c can be a lower interior surface of the body 10 if the flow channel 12 is formed within an interior of the body 10. In some embodiments, the flow channel 12 can have a top wall 14d. For example, if a flow channel 12 is formed within an interior of the body 10, the top wall 14d can be an upper interior surface of the body 10.

The width, W, of any flow channel 12 can be a distance from the first sidewall 14a to the second sidewall 14b. The depth, D, of a flow channel can be a distance from the bottom wall 14c to the top wall 14d or a distance from the bottom wall 14c to the highest point of either the first sidewall 14a or second sidewall 14b. The first and second sidewalls 14a, 14b can each have a height, ht, and a width, wd. The height, ht, and/or width, wd, of any of the first sidewall 14a and second sidewall 14b can be the same throughout the flow channel 12 or can vary. The height, ht, and/or width, wd, of the first sidewall 14a can be the same or different from the height, ht, and/or width, wd, of the second sidewall 14b. Some embodiments can include making the widths, wd, of the sidewalls 14a, 14b to be as thin or narrow as possible, which may facilitate increasing the surface area that which the body 10 can make contact with a fluid 11 that is resting against, passing over, and/or passing through the body 10.

Figure 3:
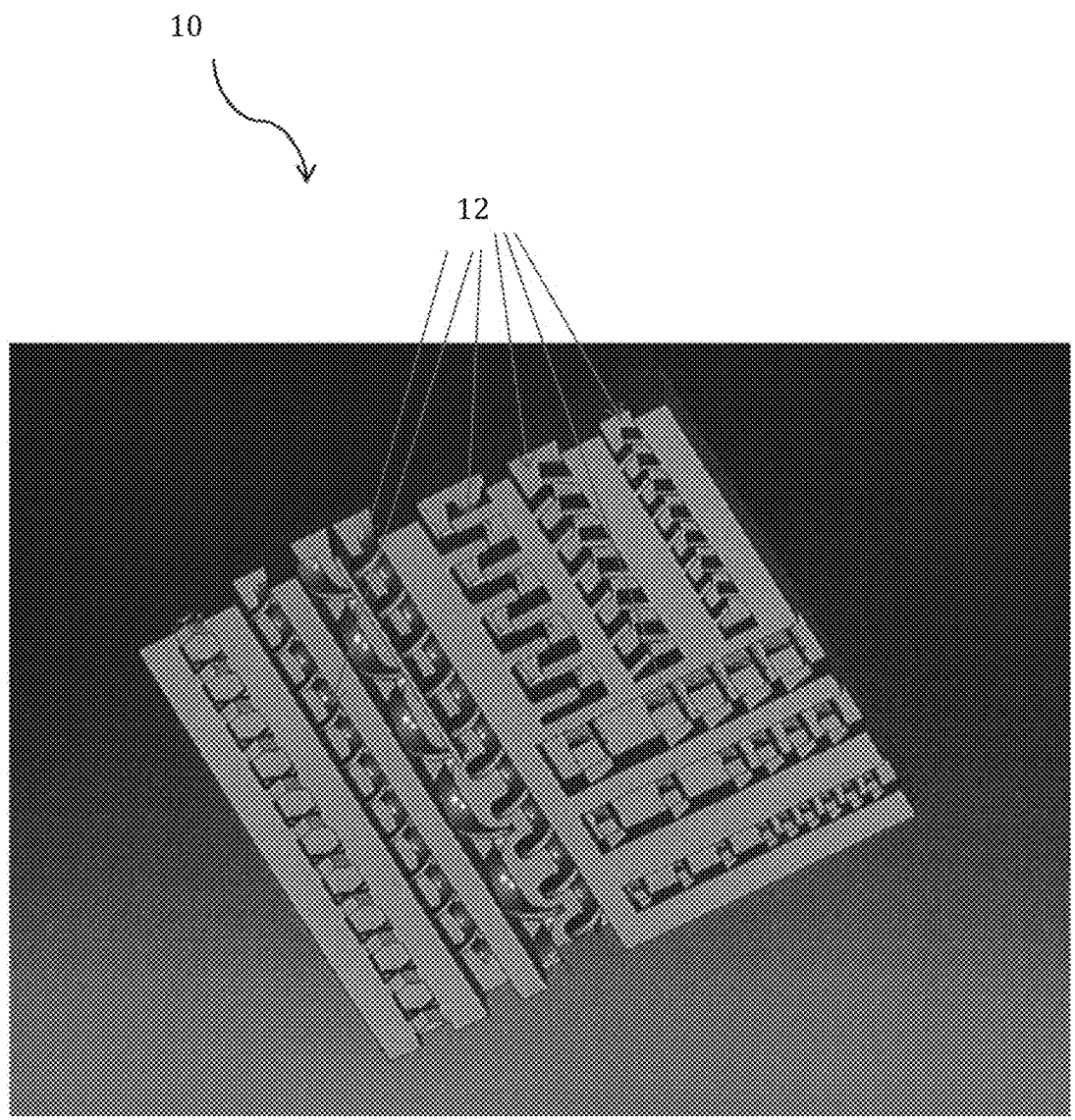
FIG. 3 shows an embodiment of the body for a transport medium having a plurality of exemplary flow channels routed in various directions.

The flow channel 12 can be formed to run from one edge 16a, 16b, 16c, 16d of the body to another edge 16a, 16b, 16c, 16d. The flow channel 12 can be formed to run from a portion of one edge 16a, 16b, 16c, 16d of the body 10 to another portion of the same edge 16a, 16b, 16c, 16d of the body 10. The flow channel 12 can be formed to run from one edge 16a, 16b, 16c, 16d of the body 10 and terminate within an area of the body 10 without extending to another edge 16a, 16b, 16c, 16d or another portion of the same edge 16a, 16b, 16c, 16d. The flow channel 12 can be formed on a first surface 18a of the body 10. The flow channel 12 can be formed to run from a first surface 18a of the body 10 to a second surface 18b of the body 10. Any portion of the flow channel 12 can be formed to run within the body 10, which may include being routed entirely through the interior of the body 10 without being at a surface 18a, 18b. The flow channel 12 can be formed to run both within the body 10 and on a surface 18a, 18b. There may be more than one flow channel 12 (see FIG. 2B). Any flow channel 12 can have the same or different length, width, depth, shape, and/or profile as another flow channel 12. Any flow channel sidewall 14a, 14b can have the same or different length, width, depth, shape, and/or profile as another flow channel sidewall 14a, 14b. Any flow channel 12 can be structured to cause fluid 11 to flow in a direction that is the same or different from another flow channel 12 (see FIG. 3).

A flow channel 12 can be structured to generate a fluid pathway 20 (see FIG. 5B) through which fluid 11 is caused to flow. Any portion of a flow channel 12 can generate a fluid pathway 20 to cause fluid 11 to flow with a certain pattern, cause fluid 11 to exhibit a flow that enhances fluid mixing, cause an increase or decrease flow volume and/or rate, cause an increase or decrease in pressure drop, cause an increase or decrease in flux, etc. Any portion of a flow channel 12 can generate fluid pathway 20 that produces a Venturi effect, a vortex, or other fluid flow effect. Any portion of a flow channel 12 can generate a fluid pathway 20 to cause fluid 11 to flow from one flow channel 12 into another flow channel 12. Any portion of a flow channel 12 can be structured to cause fluid 11 to not flow at all, but rather rest within the channel 12. Any portion of a flow channel 12 can be structured to cause fluid 11 to temporarily stop flowing, or pool, in an area of the flow channel 12.

In some embodiments, a fluid pathway 20 can be generated without forming a flow channel 12. For example, a surface 18a, 18b of the body can include surface features (e.g., undulations, ramps, protrusions, etc.) that can cause the fluid 11 to flow in a certain way. In other embodiments, the fluid channel 12 itself can have surface features to further influence fluid 11 flow.

Figure 4:
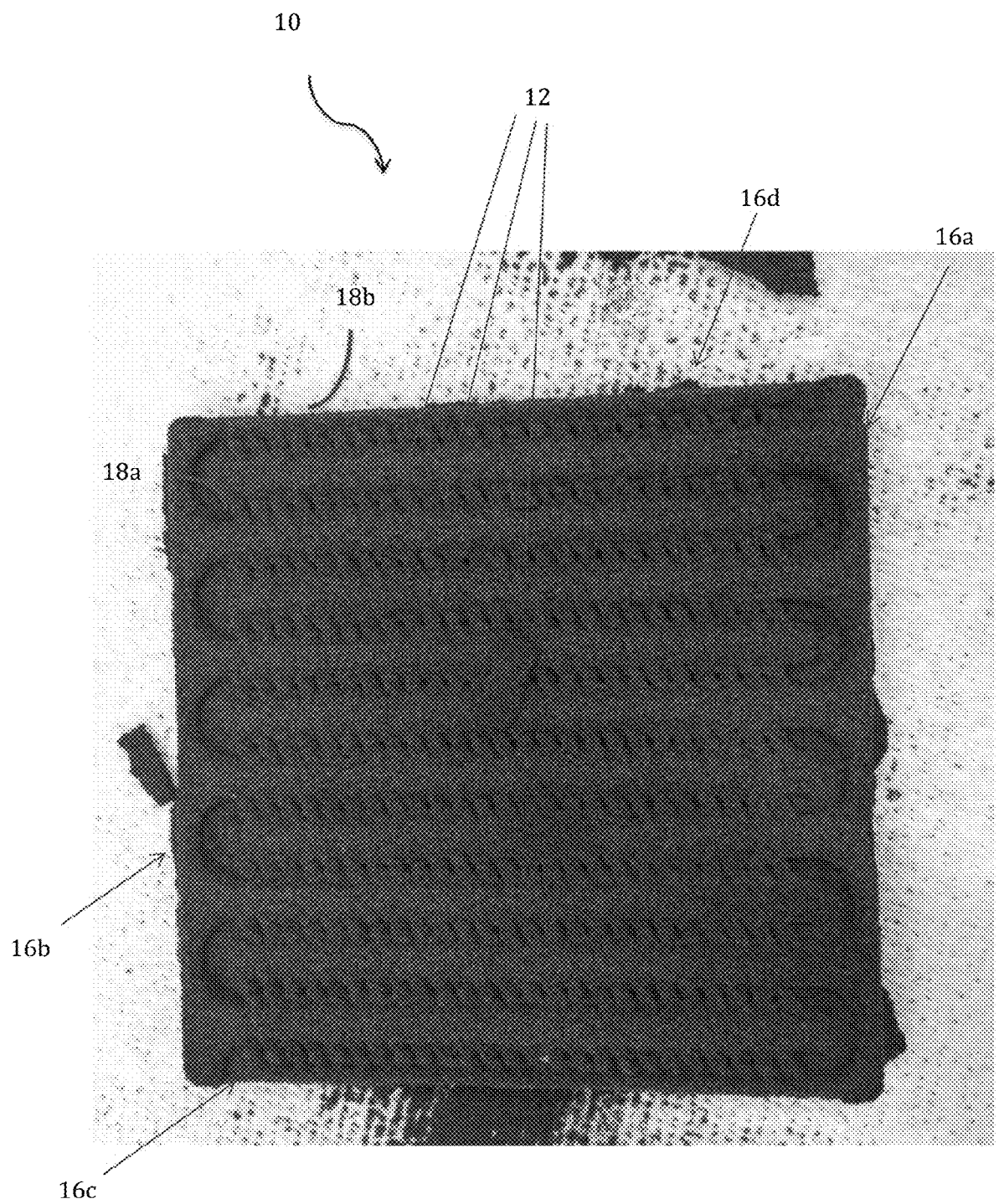
FIG. 4 shows an embodiment of the body for a transport medium configured as an electrode having a single exemplary flow channel.

Referring to FIG. 4, in an exemplary embodiment, the device can be configured as an electrode body 10. FIG. 4 shows an electrode body 10 having a single flow channel 12 extending from the first edge 16a to the third edge 16c in a serpentine line. The electrode body 10 can be an electrical conducting material, such as carbon, graphite, graphane, graphene, metal, metal alloy, etc. The electrode body 10 can be a porous material or at least semi-porous material. The electrode body 10 can be a solid material, a foam material, a felt material, a reticulated material, etc. The electrode body 10 can be structured as a planar surface having a square profile; however, any number of shapes may be used. A specific shape and profile may be used to facilitate placing the electrode body 10 within a cell stack 110 of a flow battery system 100 (see FIG. 14B). For example, the electrode body 10 can be configured as an electrical conductor to be used in an electrochemical cell 112, where the electrochemical cell 112 may be used as part of the flow battery system 100. Exemplary embodiment of a flow battery system 100 and an electrochemical cell 112 that may be used will be discussed later. The electrode body 10 can have a first planar surface 18a, a second planar surface 18b, a first edge 16a, a second edge 16b, a third edge 16c, and a forth edge 16d. The electrode body 10 can include at least one flow channel 12. The flow channel 12 can be configured to direct, or at least influence, contact or flow of electrolyte 11 resting against, flowing over, and/or flowing through the electrode body 10.

Referring to FIGS. 5A-8B, in some embodiments, the electrode body 10 can include a plurality of flow channels 12. The plurality of flow channels 12 can be formed on any of the first planar surface 18a and second planar surface 18b. In at least one embodiment, each flow channel 12 of the plurality of flow channels 12 can be routed from the first edge 16a to the second edge 16b. Each flow channel 12 can extend from a point on the first edge 16a to an opposing point on the second edge 16b, where the opposing point is subtending the point on the first edge 16a. In at least one embodiment, the first planar surface 18a can include a plurality of flow channels 12, each flow channel 12 positioned adjacent to another flow channel 12, where each flow channel 12 extends from the first edge 16a to the second edge 16b. Each flow channel 12 of the plurality of flow channels 12 can be formed as a straight flow channel, a circular flow channel, a serpentine flow channel, etc. For example, FIGS. 5A-8B show each flow channel 12 of the various embodiments extending from the first edge 16a to the second edge 16b in a straight line. The second planar side 18b can be a flat surface or include any number of flow channels 12. In at least one embodiment, the second planar side 18b can include the same or similar arrangement of flow channels 12 as that of the first planar side 18a.

In some embodiments, at least one of the third edge 16c and the fourth edge 16d can include a wall 22a, 22b that extends from the first planar surface 18a. For example, the third edge 16c can include a third edge wall 22a that extends from the first planar surface 18a. The fourth edge 16d can include a fourth edge wall 22b that extends from the first planar surface 18a. Any point on the third edge wall 22a and/or the fourth edge wall 22b can extend to a height that is lower than, flush with, or higher than any one of the flow channel sidewalls 14a, 14b. The edge walls 22a, 22b may be used to form a seal when the electrode body 10 is placed within an electrochemical cell 112. For example, a framework of an electrochemical cell 112 can compress any of the edge walls 22a, 22b against another component (e.g., a membrane 114 or a current collector 113) of the electrochemical cell 112. The compression against the electrochemical cell 112 component can form a fluid seal to prevent electrolyte 11 from flowing out through the edges at which the edge walls are formed.

Figure 5B:
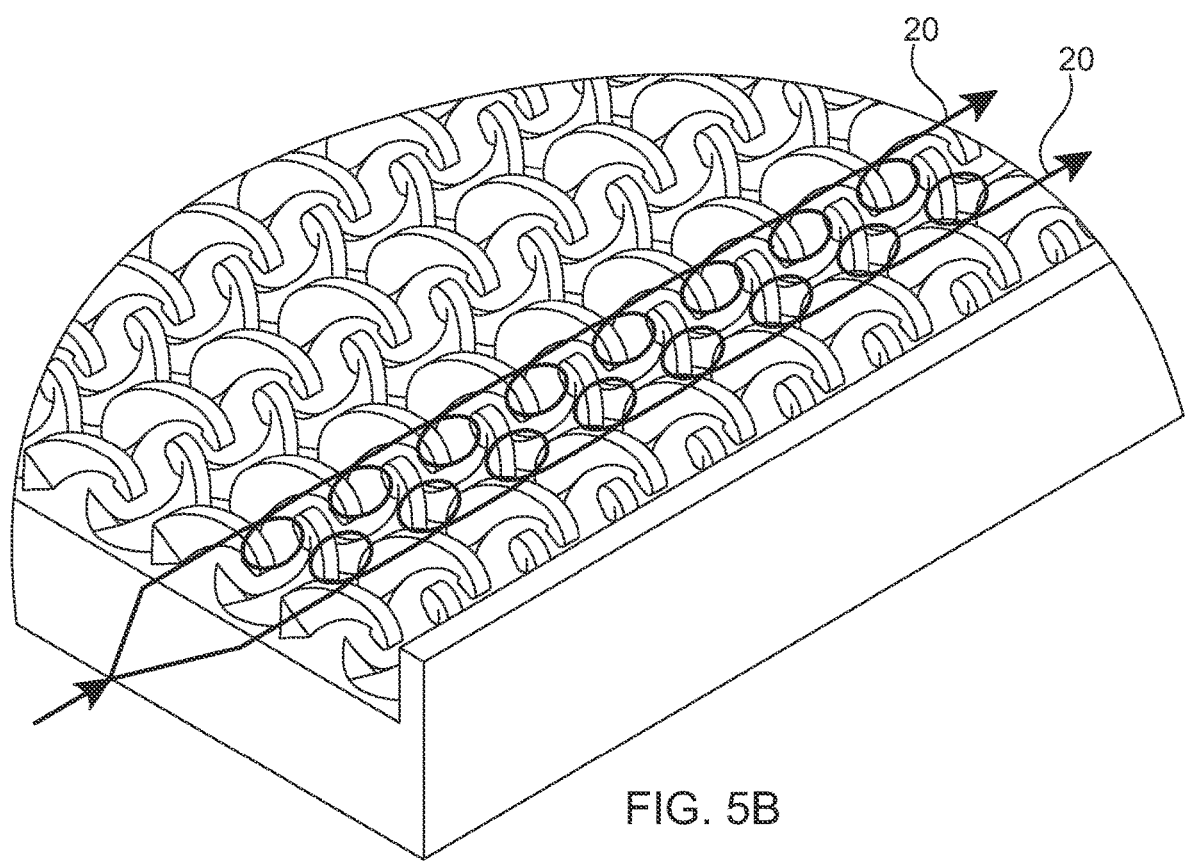
FIG. 5B is a partial exploded view of FIG. 5A.

FIGS. 5A-5B show an exemplary embodiment of a flow channel 12 configuration in which each flow channel 12 can be formed as a helix on a surface of the first planar surface 18a. For example, each flow channel 12 can exhibit a corkscrew or helix shape so as to generate a fluid pathway 20 that is helical or spiral-like. The arrangement of the plurality of flow channels 12 can be such that a helical band of a flow channel 12 can be aligned with a helical space of an adjacent flow channel 12. The helical fluid pathway 20 of each flow channel 12 can be such that it causes electrolyte 11 to flow from the first edge 16a to the second edge 16b in a helical manner.

Figure 6B:
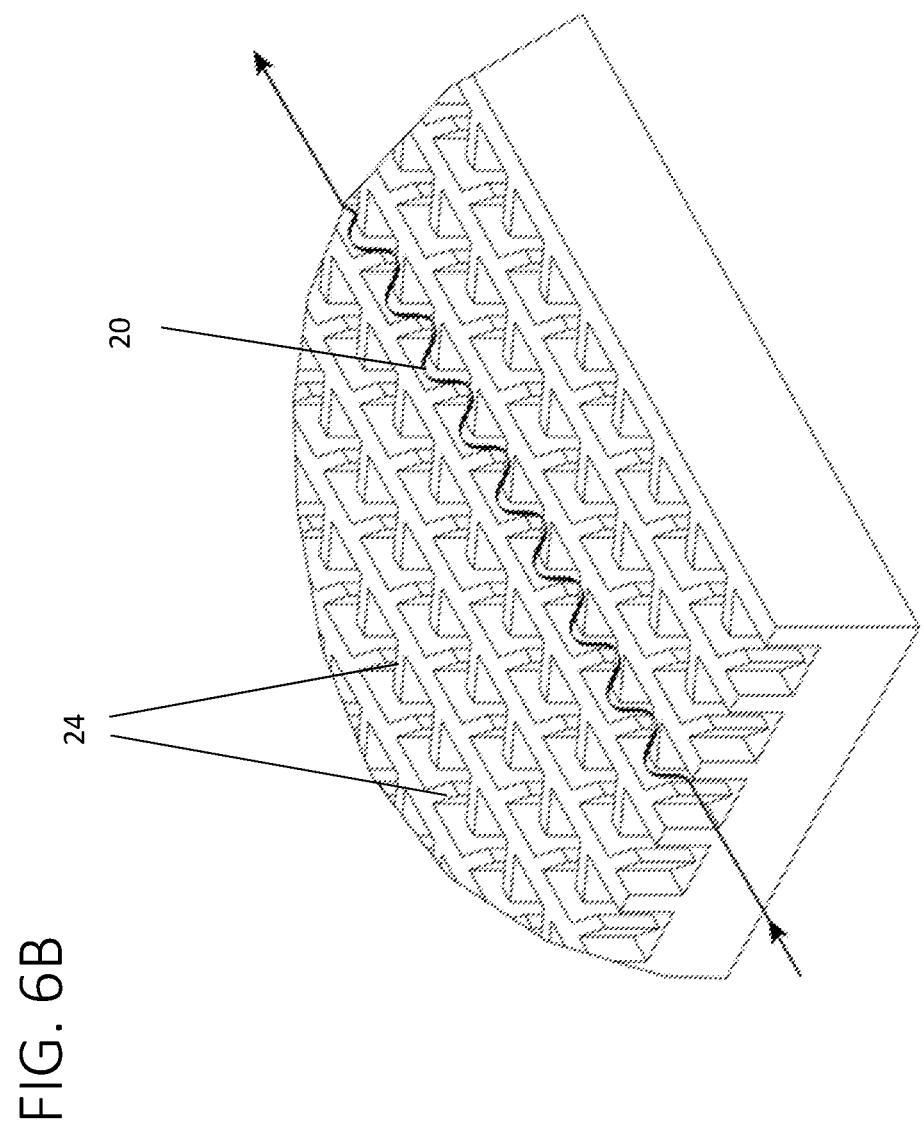
FIG. 6B is a partial exploded view of FIG. 6A.

FIGS. 6A-6B show an exemplary embodiment of a flow channel configuration in which each flow channel 12 can be formed as a serpentine on a surface of the first planar surface 18a. For example, each flow channel 12 can be square channel having a first sidewall 14a and a second sidewall 14b. At least one baffle 24 can extend from a channel sidewall 14a, 14b. The baffle 24 can extend from the first sidewall 14a towards the second sidewall 14b, and visa-versa. A baffle 24 can extend perpendicularly or at any other angle from a channel sidewall 14a, 14b. The baffle 24 from a first sidewall 14a can be aligned or misaligned with the baffle 24 of the second sidewall 14b. In some embodiments, the baffle 24 from a first sidewall 14a can be misaligned with the baffle 24 of the second sidewall 14b so as to generate an electrolyte fluid 11 pathway that is serpentine-like or sinusoidal. The serpentine-like fluid pathway 20 of each flow channel 12 can be such that it causes electrolyte 11 to flow from the first edge 16a to the second edge 16b in a serpentine manner. The baffle 24 can be straight, curved, zig-zag, sinusoidal, etc. in shape as it protrudes from the first sidewall 14a or the second sidewall 14b. The thickness of the baffle 24 can be uniform or non-uniform along its length.

Figure 7A:
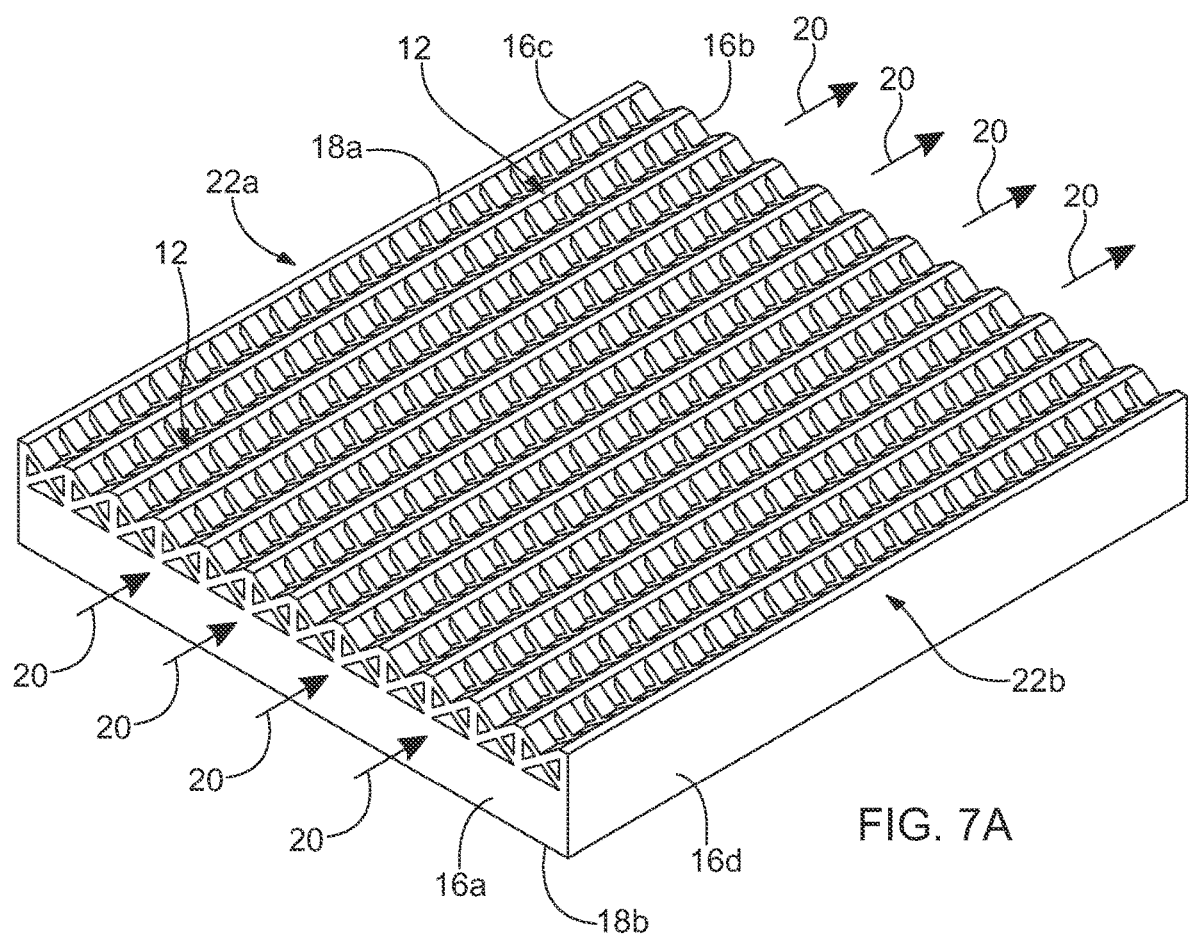
FIG. 7A shows an exemplary of a flow channel configuration for an electrode body in which each flow channel can be formed as an X-cross.
Figure 7B:
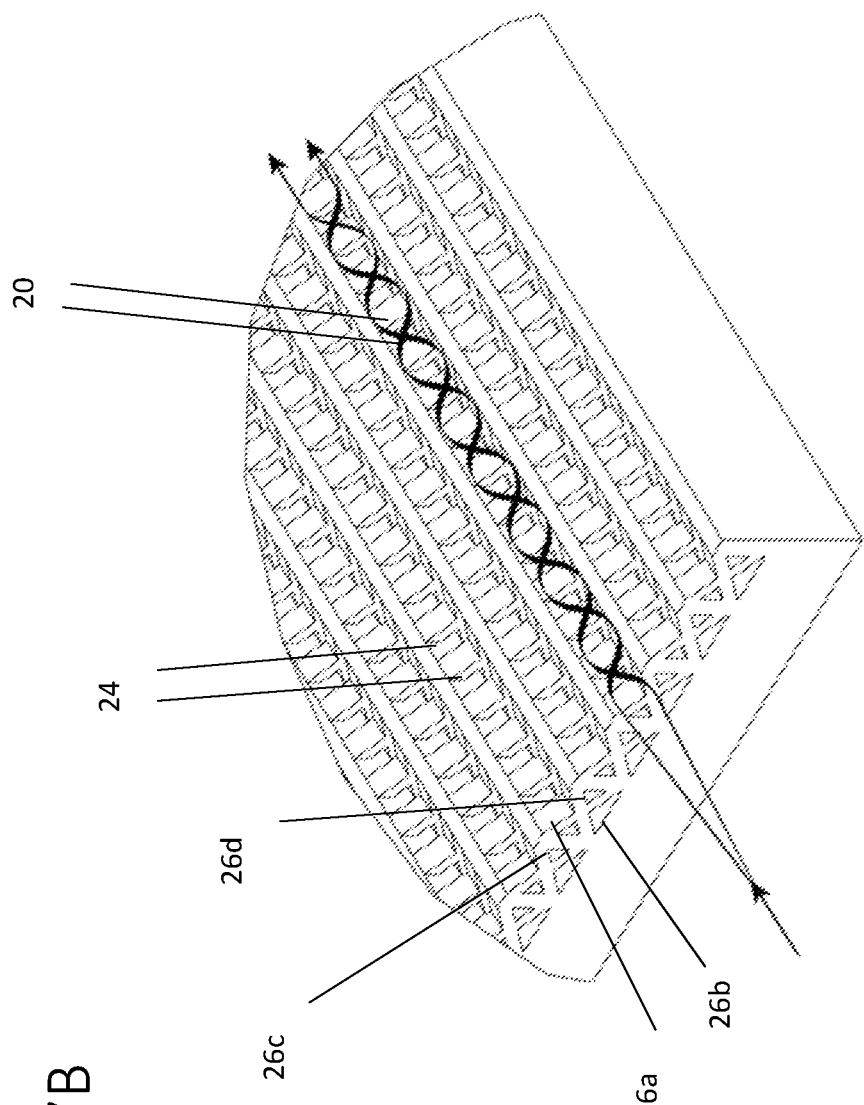
FIG. 7B is a partial exploded view of FIG. 7A.

FIGS. 7A-7B show an exemplary embodiment of a flow channel 12 configuration in which each flow channel 12 can be formed as an X-cross. The X-cross can be formed by a square shaped channel having a first sidewall 14a and a second sidewall 14b with at least one X-shaped baffle 24 formed between each sidewall 14a, 14b. The X-shaped baffle 24 can include a first cross wall extending from an upper portion of the first sidewall 14a to a lower portion of the second sidewall 14b and a second cross wall extending from an upper portion of the second sidewall 14b to a lower portion of the first sidewall 14a. The first cross wall and the second cross wall may intersect. The X-shaped baffle 24 can form an upper electrolyte flow path 26a, a lower electrolyte flow path 26b, a first side electrolyte flow path 26c, and a second side electrolyte flow path 26d. Any of the flow paths 26a-26d can be blocked on any of the X-shaped baffles 24. For example, an X-shaped baffle 24 can include an open first side electrolyte flow path 26c and a closed second side electrolyte flow path 26d, where an adjacent X-shaped baffle 24 can include an open second side electrolyte flow path 26d and a closed first side electrolyte flow path 26c. This can cause the electrolyte 11 to flow through the X-shaped baffles 24 in a crisscross manner. The crisscross fluid pathway 20 of each flow channel 12 can be such that it causes electrolyte 11 to flow from the first edge 16a to the second edge 16b in a crisscross manner.

Figure 8A:
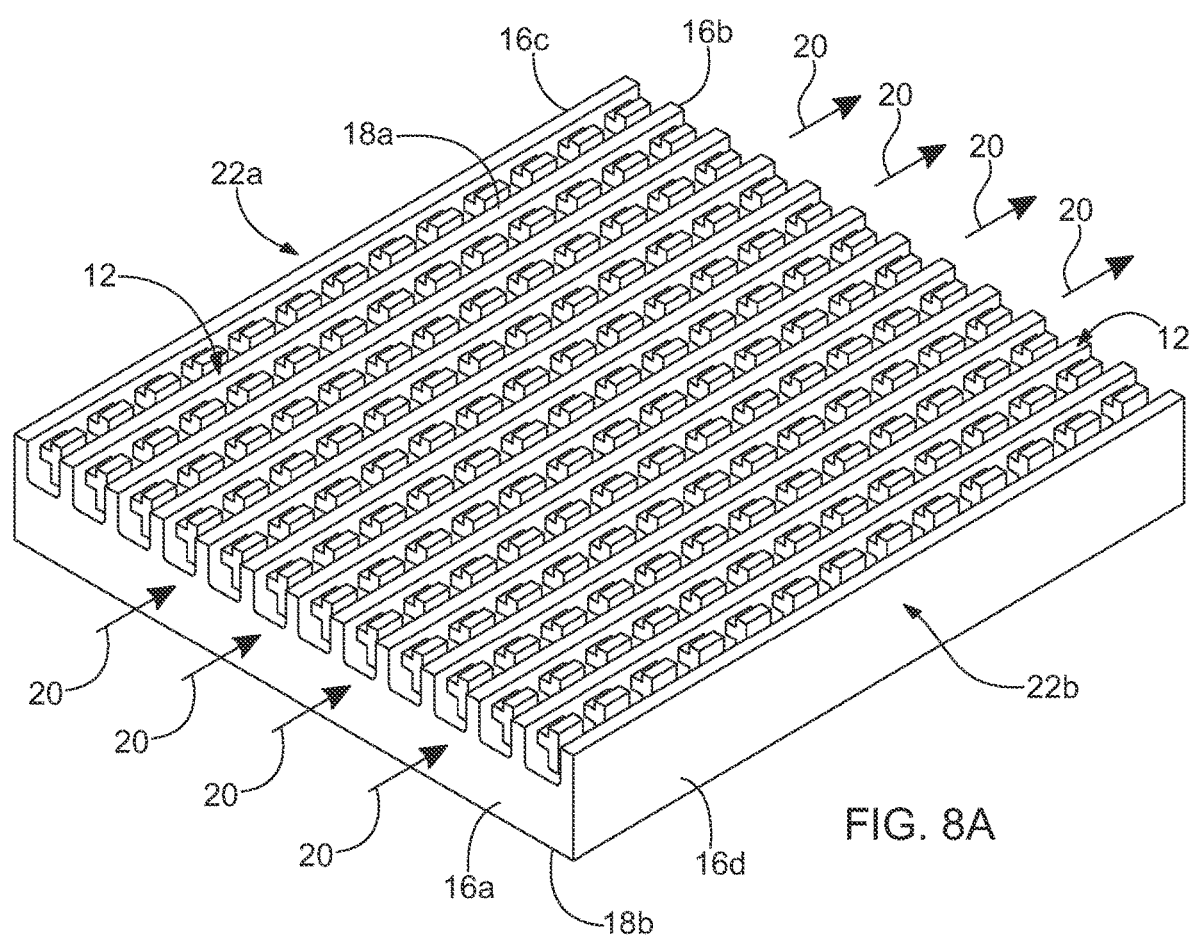
FIG. 8A shows an exemplary of a flow channel configuration for an electrode body in which each flow channel can be formed as a post-type shape.
Figure 8B:
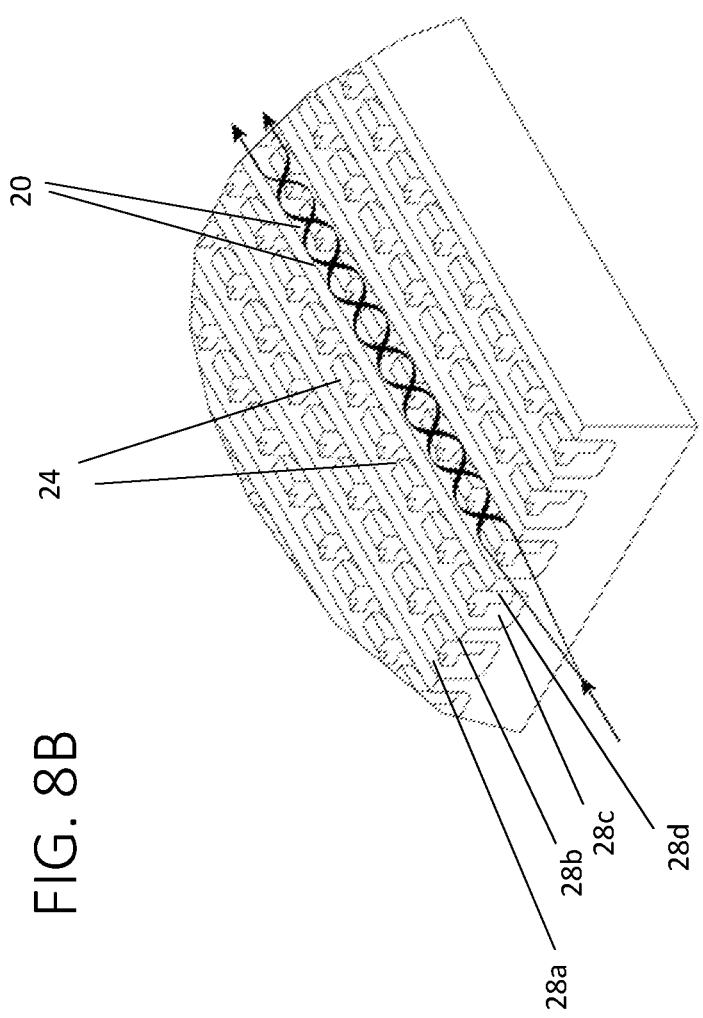
FIG. 8B is a partial exploded view of FIG. 8A.

FIGS. 8A-8B show an exemplary embodiment of a flow channel configuration in which each flow channel 12 can be formed as a post-type channel. The post-type channel 12 can be formed by a square shaped channel having a first sidewall 14a and a second sidewall 14b with at least one post baffle 24 formed therein. The post baffle 24 can include a cross-shaped member extending from the first sidewall 14a and/or second sidewall 14b. The cross-shaped member can form an upper first side electrolyte flow path 28a, an upper second side electrolyte flow path 28b, a lower first side electrolyte flow path 28c, and a lower second side electrolyte flow path 28d. A post-type baffle 24 can be attached to the first sidewall 14a and an adjacent post-type baffle 24 can be attached to the second sidewall 14b. This alternating arrangement can continue along at least a portion of the length of the flow channel 12. The alternating arrangement can cause the electrolyte 11 to flow through the flow channel 12 in a crisscross manner. The crisscross fluid pathway 20 of each flow channel 12 can be such that it causes electrolyte 11 to flow from the first edge 16a to the second edge 16b in a crisscross manner.

Figure 9A:
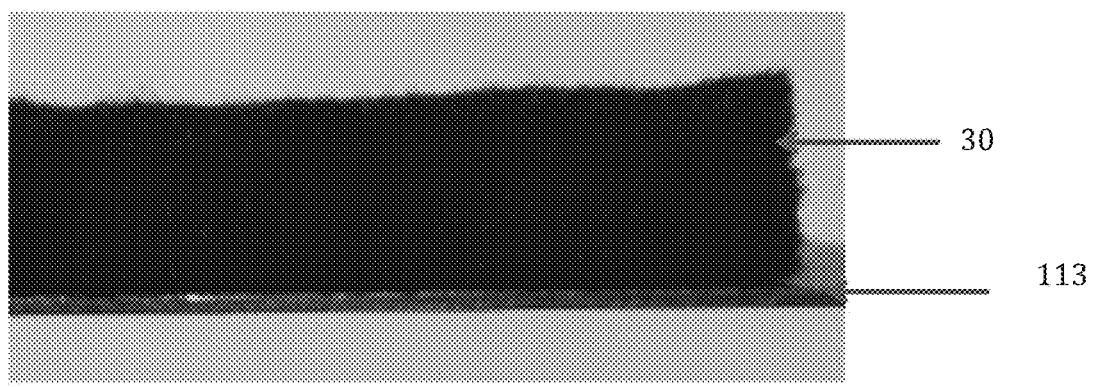
FIG. 9A shows an embodiment of an electrode body formed as a carbon felt material. The electrode is shown adjacent a current collector.
Figure 9B:
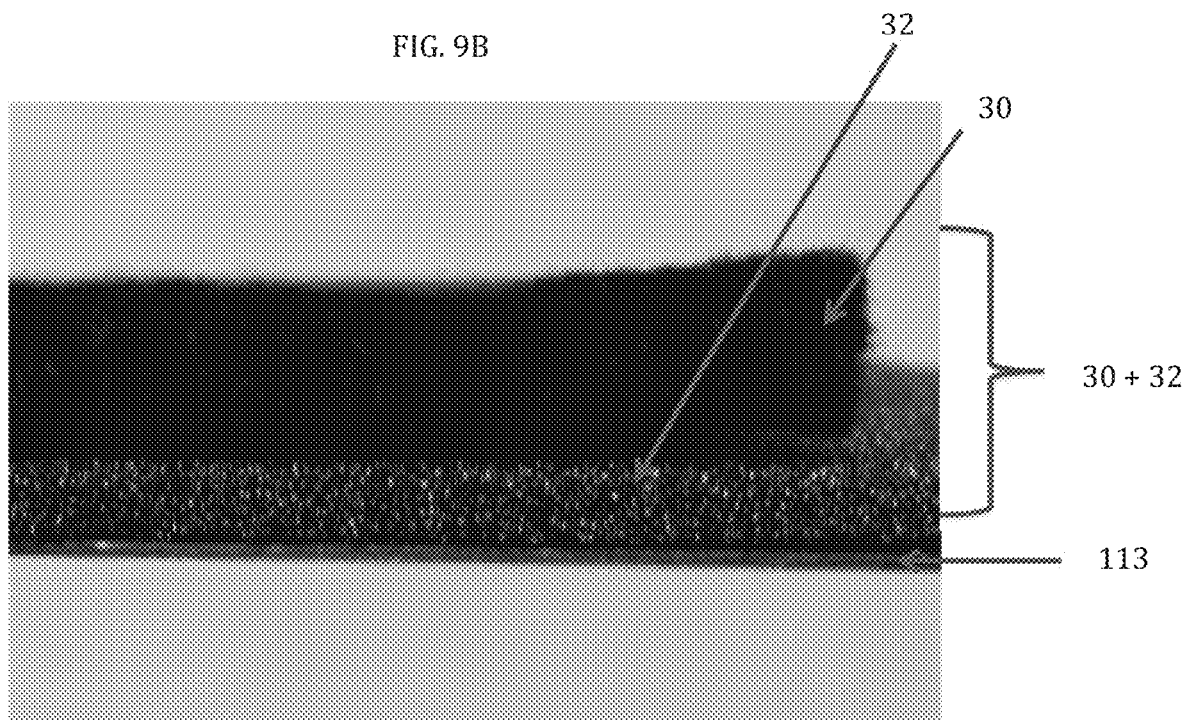
FIG. 9B shows an embodiment of an electrode body as a carbon felt/carbon foam composite material. The electrode is shown adjacent a current collector.

Referring to FIGS. 9A-9B, in addition, or in the alternative, to the various flow channel 12 configurations described herein, the electrode body 10 can be formed from different materials and material configurations to influence flow characteristics, such as contact time, surface-contact, electrolyte mixing, etc. For example, the electrode body 10 can include a felt material 30, as shown in FIG. 9A. Note that the felt electrode 30 in FIG. 9A is shown adjacent to a current collector 113, which may be a graphite current collector 113. Alternatively, the electrode body 10 can include a carbon foam material 32. The carbon foam material 32 can be reticulated vitreous carbon foam. In at least one embodiment, the electrode body 10 can include a composite material. This can include a carbon felt/foam composite material construction shown in FIG. 9B. Note that the carbon foam electrode body 10 (30+32) in FIG. 9B is shown adjacent a current collector 113, which may be a graphite current collector 113.

The carbon felt/foam electrode body 10 can include at least one carbon felt layer 30 and at least one carbon foam layer 32. The carbon felt layer(s) 30 can be configured to provide a reaction zone for the electrode body 10. For example, the carbon felt layer(s) 30 can have high specific surface area and high electrical conductivity. The carbon felt layer(s) 30 can also be configured to provide mechanical strength and other mechanical properties that may be desired when using the electrode body 10 as part of a cell stack 110 in a flow battery system 100. The carbon foam layer(s) 32 can be configured to provide a low-pressure path to supply electrolyte 11 to the felt layer(s) 30.

Figure 10:
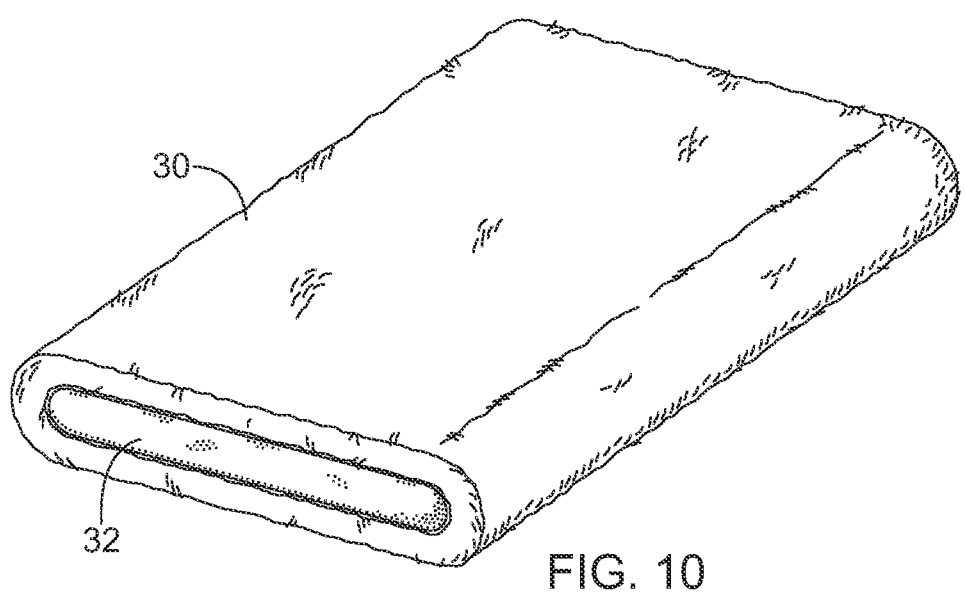
FIG. 10 shows an exemplary electrode body including a carbon foam core and a felt outer shell.

Referring to FIG. 10, in at least one embodiment, the electrode body 10 can include a rigid carbon foam core 32 and compressible carbon felt outer shell 30. It is contemplated that when a composite carbon felt/foam electrode 10 is used in an electrochemical cell 112 of a flow battery system 100 (see FIG. 14A), one felt side 30 of the electrode body 10 may be placed against a current collector 113 and the other felt side 30 of the electrode body 10 may be placed against a membrane 114 of the electrochemical cell 112. In one embodiment, the felt outer shell 30 may be used to provide reaction zones at both the membrane 114 and the current collector 113. In at least one embodiment, the felt outer shell 30 may be used to provide an unbroken electrical connection between membrane 114 and the current collector 113. The carbon foam layer 32 may provide a porous path for electrolyte 11 to mix and exchange electrolyte reduction/oxidation ("redox") constituents in the felt layer 30.

In some embodiments, at least one fluid channel 12 can be formed within and/or on the carbon/felt electrode body 10 in any manner described herein. For example, the fluid channel 12 can be formed within and/or on any one of the carbon foam layer(s) 32 and/or the carbon felt layer(s) 30. The various fluid channel 12 configurations and/or any of the characteristics of the porous structure, the reaction zone, and/or the low-pressure paths of the composite carbon felt/foam electrode body 10 can be used to direct, or at least influence, flow of electrolyte and/or influence the transfer of electrical charge from the electrolyte 11 to and/or from the electrode body 10.

Any of the flow channels 12, surface features, and/or material compositions can be used to develop unique flow control features, which may lead to improved electrolyte 11 characteristics. The improved electrolyte 11 characteristics may include improved electrolyte 11 flow within an electrochemical cell 112 and/or minimizing pressure drop within an electrochemical cell 112. For example, any of the flow channels 12, surface features, and/or material compositions can be used to increase or decrease contact-time and/or surface-contact. Any of the flow channels 12, surface features, and/or material compositions can cause the electrolyte 11 to temporarily stop flowing, or cause it to pool, at certain locations. Any of the flow channels 12, surface features, and/or material compositions can enhance mixing in the flow of electrolyte 11. The mixing can be used to perturb the boundary layer of the flowing electrolyte 11 to achieve a higher gradient in the remaining active molecules in the electrolyte 11 stream. This can enable more charge to be transferred and/or increase the rate of charge transfer. Some embodiments can include flow channels 12, surface features, and/or material compositions that reduce the column thickness of the electrolyte 11 that may be in contact with a surface of the electrode body 10. In other words, the electrode body 10 can be configured to cause the electrolyte 11 to not only increase the contacting surface area of the electrode 10, but also increase the amount of electrolyte 11 that makes contact with the surface of the electrode 10 by causing the electrolyte to be spread thin. Thinner columns of electrolyte 11 that make contact with a surface of the electrode body 10 may allow for more charge to be transferred and/or allow for an increased rate of charge transfer.

When attempting to increase the surface area that which the body 10 can make contact with electrolyte 11 that is resting against, passing over, and/or passing through the body 10, the widths of any of the surface ornamentations, protrusions, baffles 24, sidewalls 14a, 14b, etc. may be made as thin as possible to effectuate such maximization of surface area exposure.

In a non-limiting exemplary embodiment, embodiments of the electrode body 10 can be fabricated using additive manufacturing techniques. For example, any of the carbon felt 30 and/or carbon foam 32 layers can be fabricated using additive manufacturing techniques. Additive manufacturing techniques can also be used to generate the flow channels 12 as the electrode body 10 is being generated. Some uses of additive manufacturing can be used to develop any of the unique flow control features disclosed herein, which may lead to improved electrolyte 11 characteristics. Furthermore, additive manufacturing could offer advantages over other manufacturing processes, which may include, for example, facilitating generation of hollow structures that can provide high surface areas to allow the redox reaction to occur more efficiently. The hollow structures can be the flow channels 12 and/or portions of the flow channels 12 (e.g., the baffles 24, surface ornamentations of the flow channels 12, specific widths, heights, lengths, etc.).

Figure 11A:
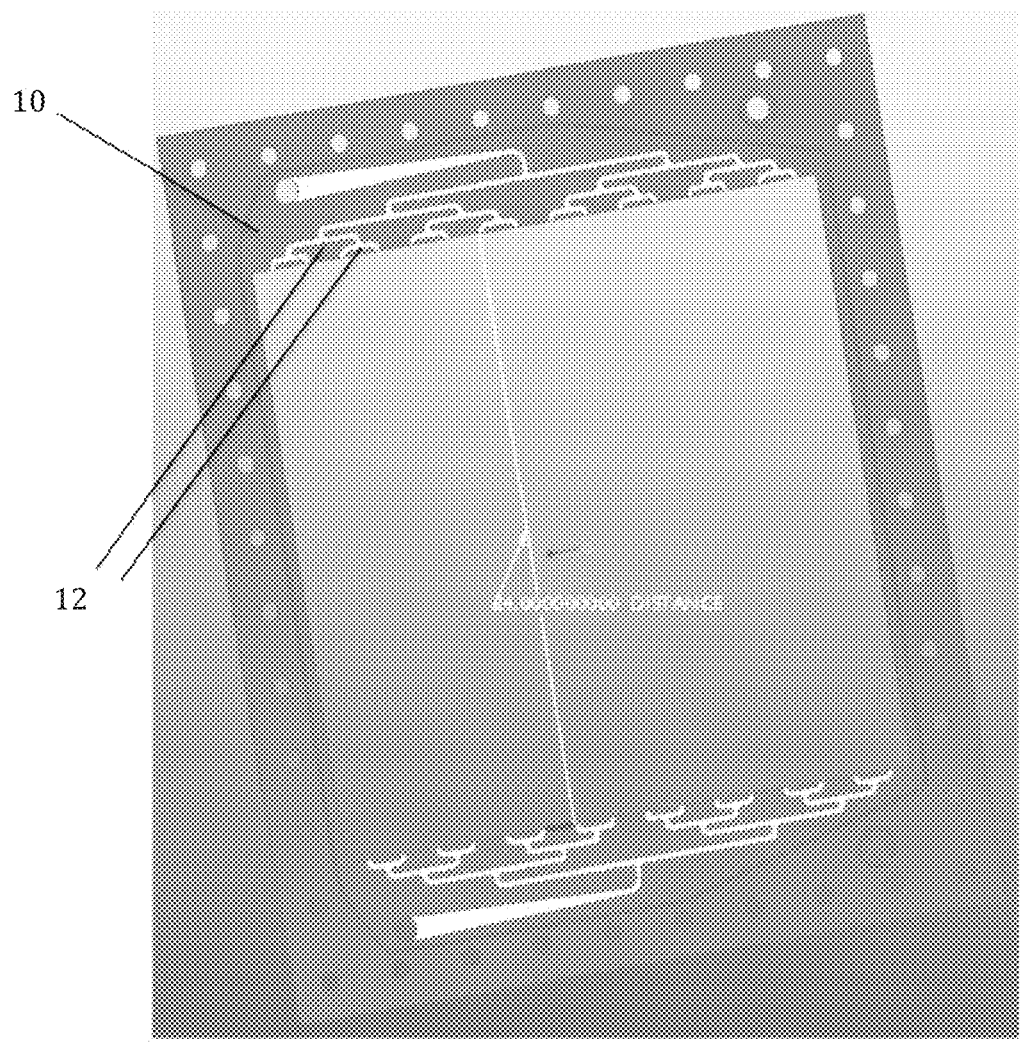
FIGS. 11A-11B show exemplary electrode bodies being generated via additive manufacturing.
Figure 11B:
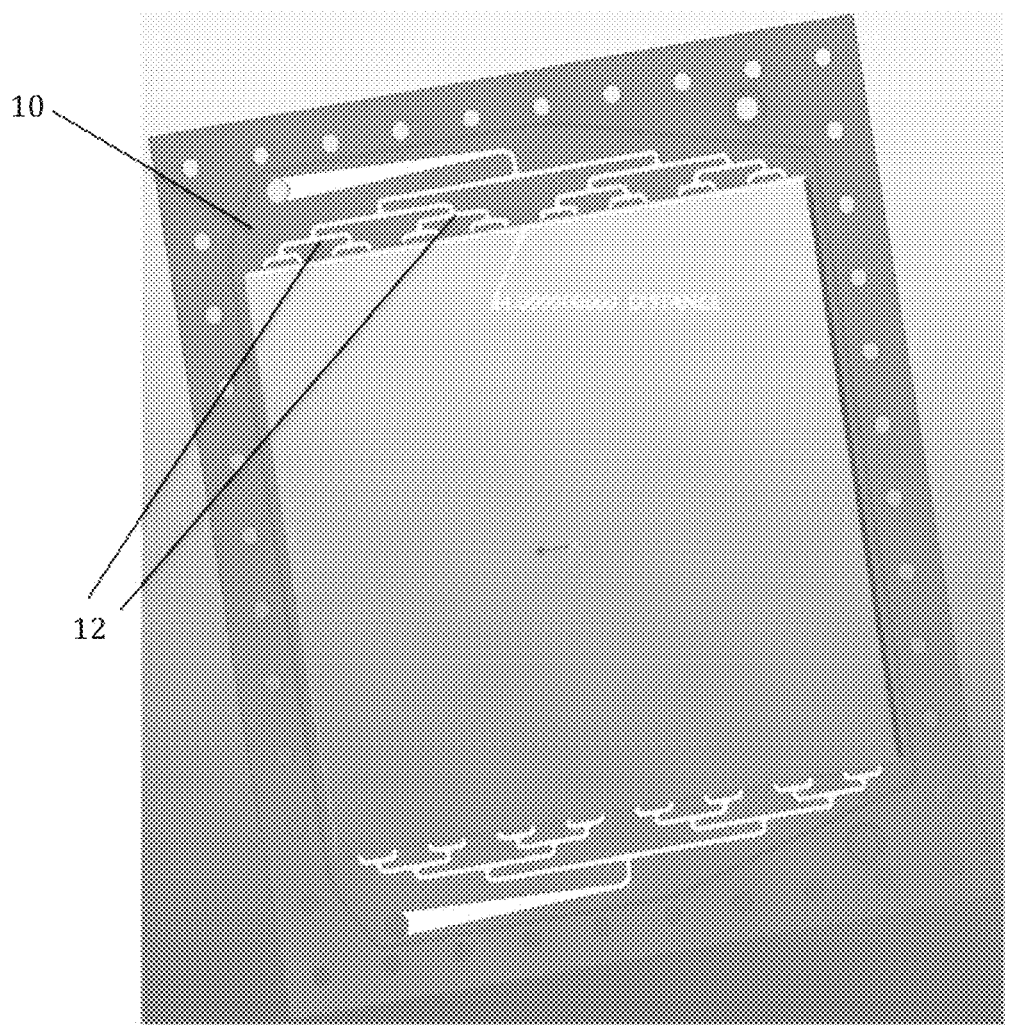

FIGS. 11A-11B show exemplary electrodes 10 being generated via additive manufacturing. As can be seen, the additive manufacturing process may be used to create the flow channels 12 as the electrode body 10 is being formed. In at least one embodiment, electrode body 10 preforms can be generated, which may be made from carbon and/or graphite. Carbon powder having 90% or more by weight of particles of size ranging from 45 micrometers to 50 micrometers may be used for the additive manufacturing process to generate any portion of the electrode body 10; however, graphite powder having 90% or more by weight of particles of size ranging from 50 micrometers to 80 micrometers can also be used. It should be noted that powder size may have an effect on the porosity of at least a portion of the electrode body 10. As the preforms are being made, flow channels 12 can be formed on a surface of the body 10 and/or within the body 10. In one exemplary embodiment, the flow channels 12 may have a width within a range from 75 micrometers to 150 micrometers. Of course, other flow channel width ranges are also contemplated, as will be understood by one skilled in the art. The electrode body preform can be formed into a planar member with a square profile, as shown in FIGS. 11A-11B. The electrode body 10 can be densified and/or sealed, as will be understood by one skilled in the art. In some embodiments, an electrode body 10 may exhibit an electrical conductivity of at least 100 milliamps per square centimeter.

Figure 12A:
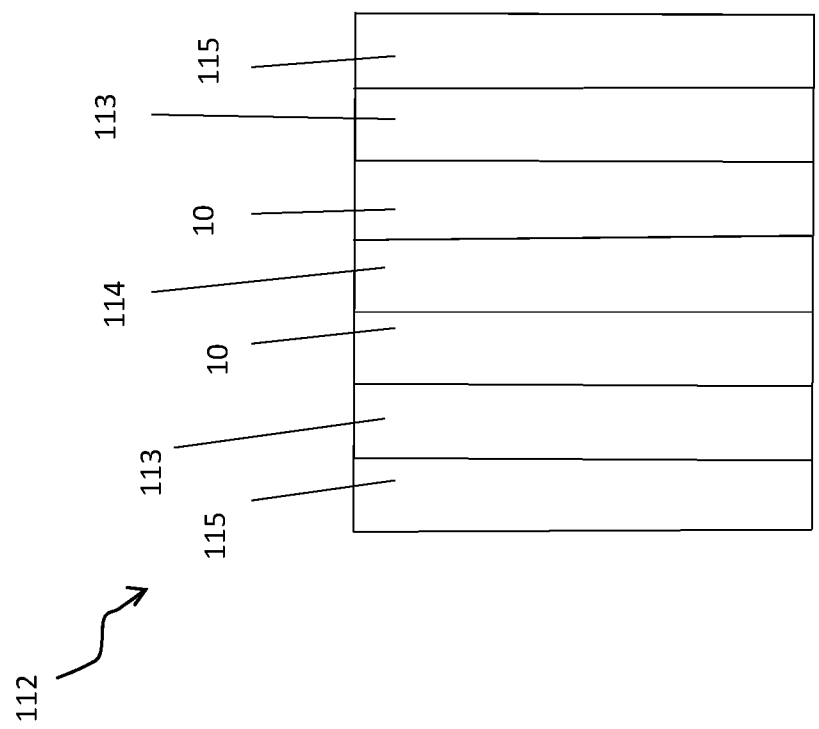
FIGS. 12A-12C show a schematic of an exemplary electrochemical cell that may be formed by using an embodiment of the electrode body, an exemplary electrochemical cell configuration that may be used in a cell stack, and an edge view of a cell stack framework to illustrate inlets and outlets of the framework, respectively.

FIG. 12A shows a schematic of an exemplary electrochemical cell 112 that may be formed by using an embodiment of the electrode body 10. As a non-limiting example, the electrochemical cell 112 can include a first end plate 115 adjacent a first current collector 113. The first current collector 113 may be adjacent a first electrode 10 (e.g., a positive electrode). The first electrode 10 may be adjacent a membrane 114. The membrane 114 may be adjacent a second electrode 10 (e.g., a negative electrode). The second electrode 10 may be adjacent a second current collector 113. The second current collector may be adjacent a second end plate 115. The end plates 115 may be structured as a frame to contain the current collectors 113, electrodes 10, and membrane 114, while providing a chamber through which electrolyte 11 can pass. The end plates 115 of the frame may be secured together via a fastener, fused together, or otherwise sealed. Any of the end plates 115 or other components can include inlets 117 and/or outlets 117 to allow electrolyte 11 to pass into and out from the chamber created between the plates 115 (see FIG. 12C). For example, the inlets 117 and/or outlets 117 can be configured to facilitate fluid communication with a manifold. The manifold can be in further fluid communication with electrolyte tanks 120a, 120b of a flow battery system 100 (see FIG. 13).

Figure 12B:
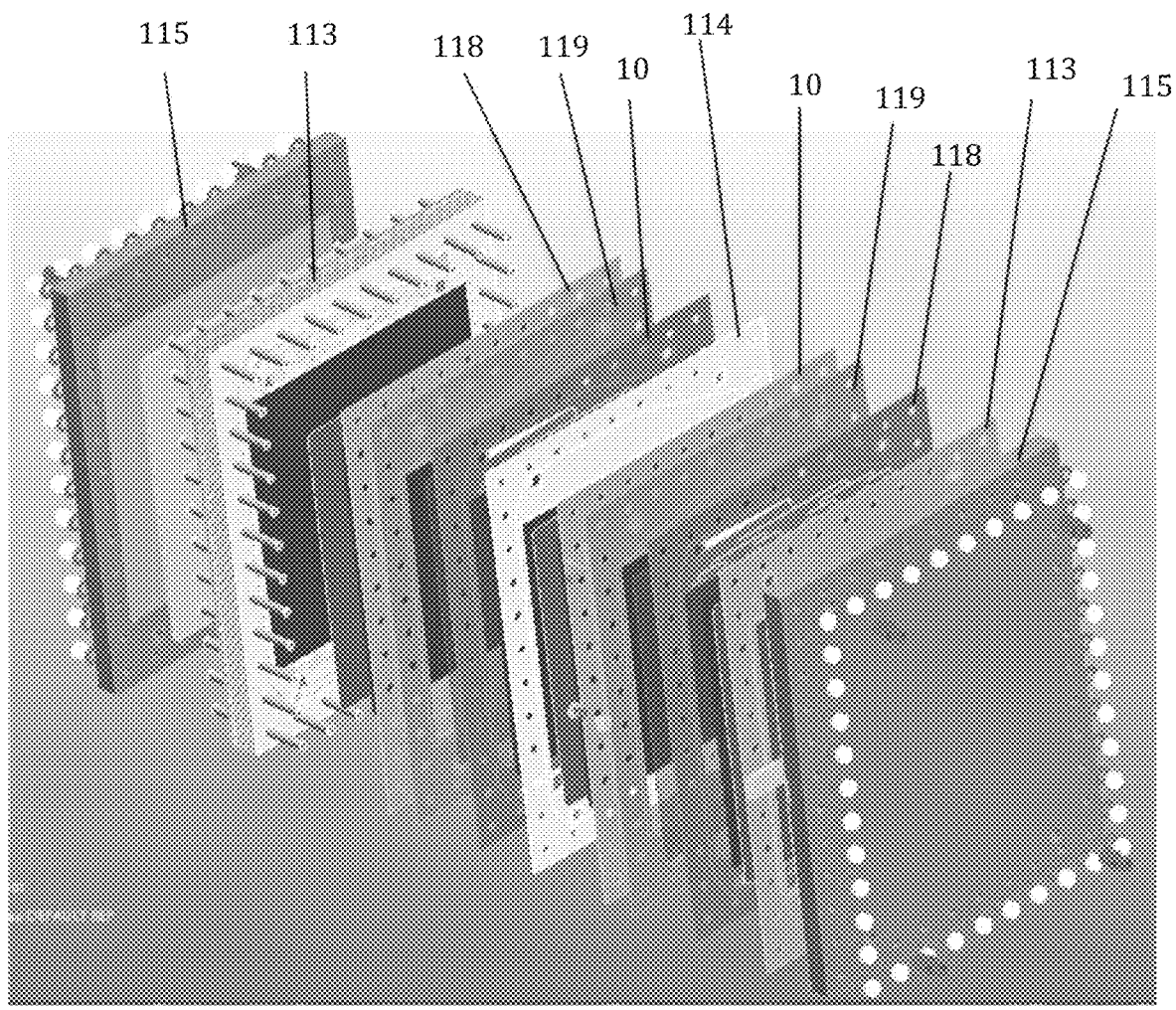
Figure 12C:
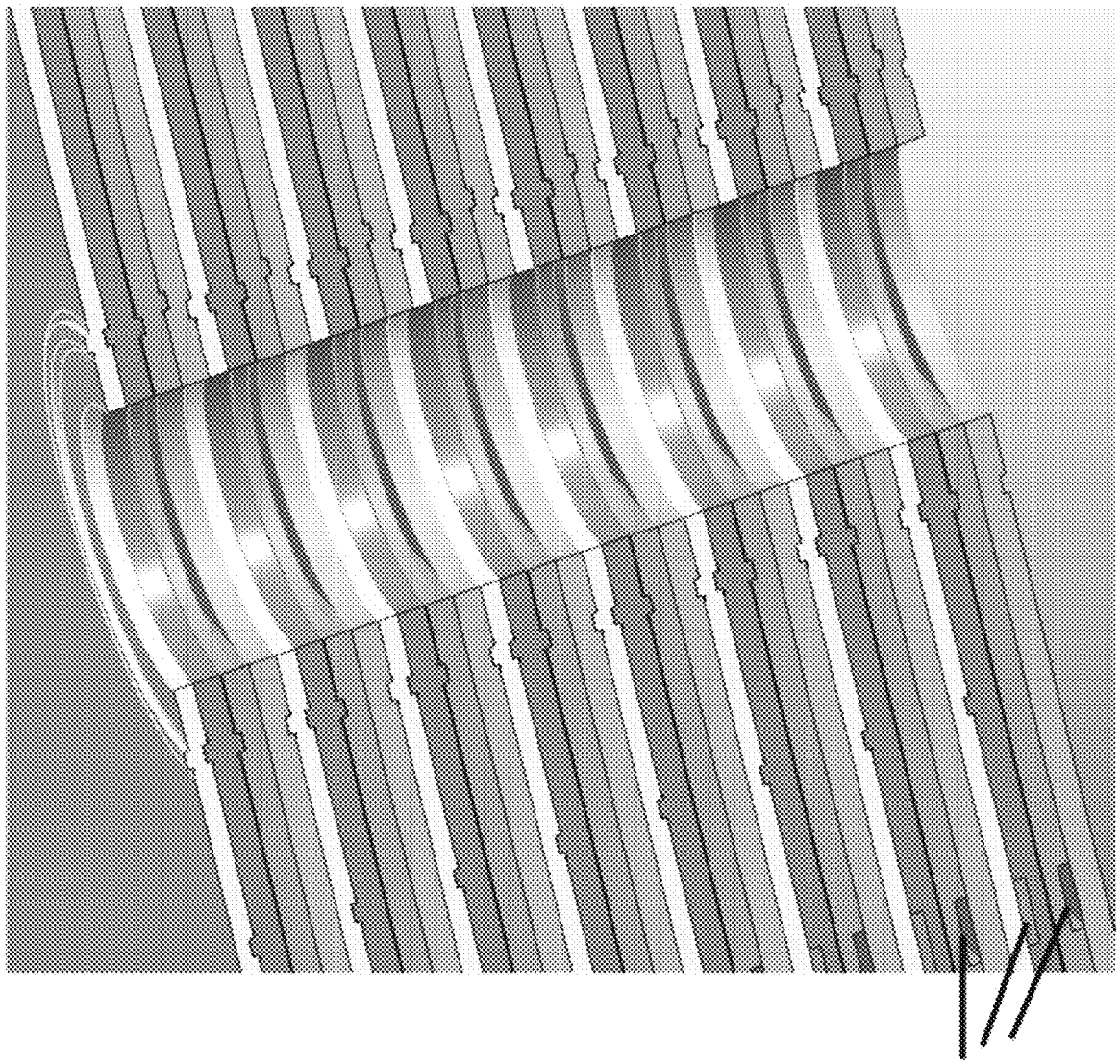

The electrochemical cell 112 shown in FIG. 12A is only an exemplary embodiment of how an electrochemical cell 112 may be configured. Other configurations can be made. For example, mono-polar and/or bi-polar plates may be used to generate multiple electrochemical cell 112 arrangements. Multi electrochemical cell 112 arrangements can be used to generate at least one cell stack 110. For example, FIG. 12B shows an example of cell stack 110 made up of component layers that may be used in a bi-polar plate configuration. As can be seen from FIG. 12B, the electrochemical cell 112 can include a first end plate 115 adjacent a first current collector 113. The first current collector 113 may be adjacent a first flow frame 118. The first flow frame 118 may be adjacent a first bipolar plate 119. The first bipolar plate 119 may be adjacent a first electrode 10 (e.g., a positive electrode). The first electrode 10 may be adjacent a membrane 114. The membrane 114 may be adjacent a second electrode 10 (e.g., a negative electrode). The second electrode 10 may be adjacent a second bipolar plate 119. The second bipolar plate 119 may be adjacent a second flow frame 118. The second flow frame 118 may be adjacent a second current collector 113. The second current collector 113 may be adjacent a second end plate 115. The end plates 115 may be structured as a frame to contain the current collectors 113, electrodes 10, bipolar plates 119, flow frames 118, and membrane 114, while providing a chamber through which electrolyte 11 can pass. The flow frames 118 may be structured to compartmentalize the cells in the multi-cell stack 110 arrangement and provide a chamber through which electrolyte 11 can pass. The end plates 115 of the frame may be secured together via a fastener, fused together, or otherwise sealed. Any of the end plates 115, flow frames 118, or other components can include inlets 117 and/or outlets 117 to allow electrolyte 11 to pass into and out from the chamber created between the plates 115 (see FIG. 12C).

Figure 13:
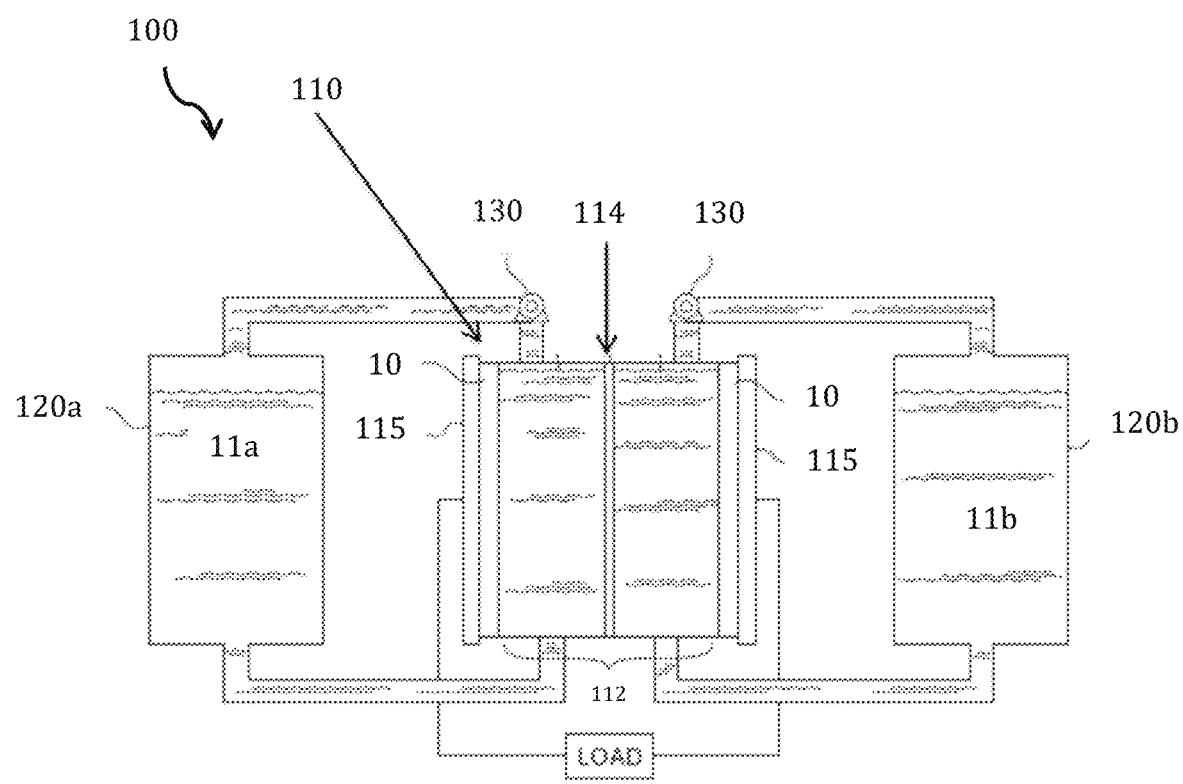
FIG. 13 shows an exemplary flow battery system that may include use of an embodiment of the electrode body.

Referring to FIG. 13, embodiments of the electrode 10 can be used as part of a flow battery system 100. For example, the electrode body 10 can be used as part of an electrochemical cell 112 and/or a cell stack 110 of a flow battery system 100. In one embodiment, a flow battery system 100 can be configured as a rechargeable battery electrochemical cell that may exploit fluid dynamics, kinetics, and/or chemical potential properties of electrolyte 11 to convert chemical energy to electrical energy. The electrolytes 11 may include at least one catholyte fluid 11a and at least one anolyte fluid 11b. An electrolyte 11 may include, but is not limited to, vanadium, quinone, etc. Any of the electrolytes 11 can be stored in separate electrolyte tanks 120a, 120b. At least one pump 130 may be used to direct the electrolytes 11 from the electrolyte tank 120a, 120b and into a cell stack 110. The cell stack 110 may include one or more electrochemical cells 112. The electrolytes 11 may be caused to come into contact with at least one electrode 10 of the electrochemical cell 112 to generate electrical energy. The electrical energy may then be stored in current collectors 113 of the electrochemical cell 112 and/or cell stack 110. A power source or load can be placed into electrical communication with the electrochemical cell(s) 112 to selectively draw electrical power from the flow battery system 100. It should be understood that other flow battery systems 100 and configurations can be used, and that the flow battery system 100 of FIG. 13 is only one exemplary system that may be used.

In some embodiments, the flow battery system 100 can be used for leveling and/or stabilizing intermittent electrical energy generation sources, such as wind-energy generation systems, solar-energy generation systems, etc. Further embodiments can include a flow battery system 100 can be configured with chemically stable redox couples, having large potential differences with high solubility of both oxidized and reduced species and/or fast redox kinetics. Additionally, the flow battery system 100 can include low-cost, efficient, and/or durable electrodes, which may include any of the electrode embodiments disclosed herein. The flow battery system 100 can further include use of an electrode structure and cell stack design that minimizes transport losses, which also may include any of the electrode embodiments disclosed herein. In some embodiments, the flow battery system 100 can also include highly permeable, selective, and/or durable membranes 114. Any of the flow battery system 100 elements disclosed herein can be configured to further provide minimal pumping and shunt current losses. In at least one embodiment, the flow battery system 100 can be configured for large-scale power and system management and grid integration.

Figure 14A:
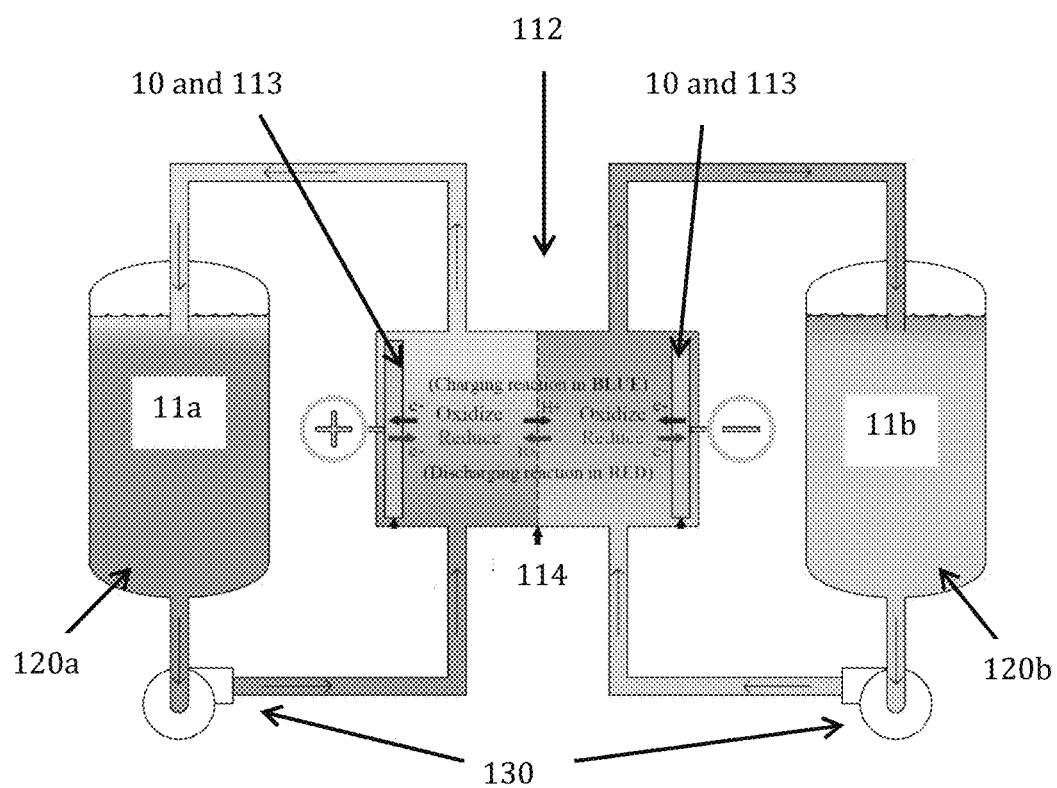
FIGS. 14A-14B show additional exemplary flow battery systems that may include use of an embodiment of the electrode body, where
Figure 14B:
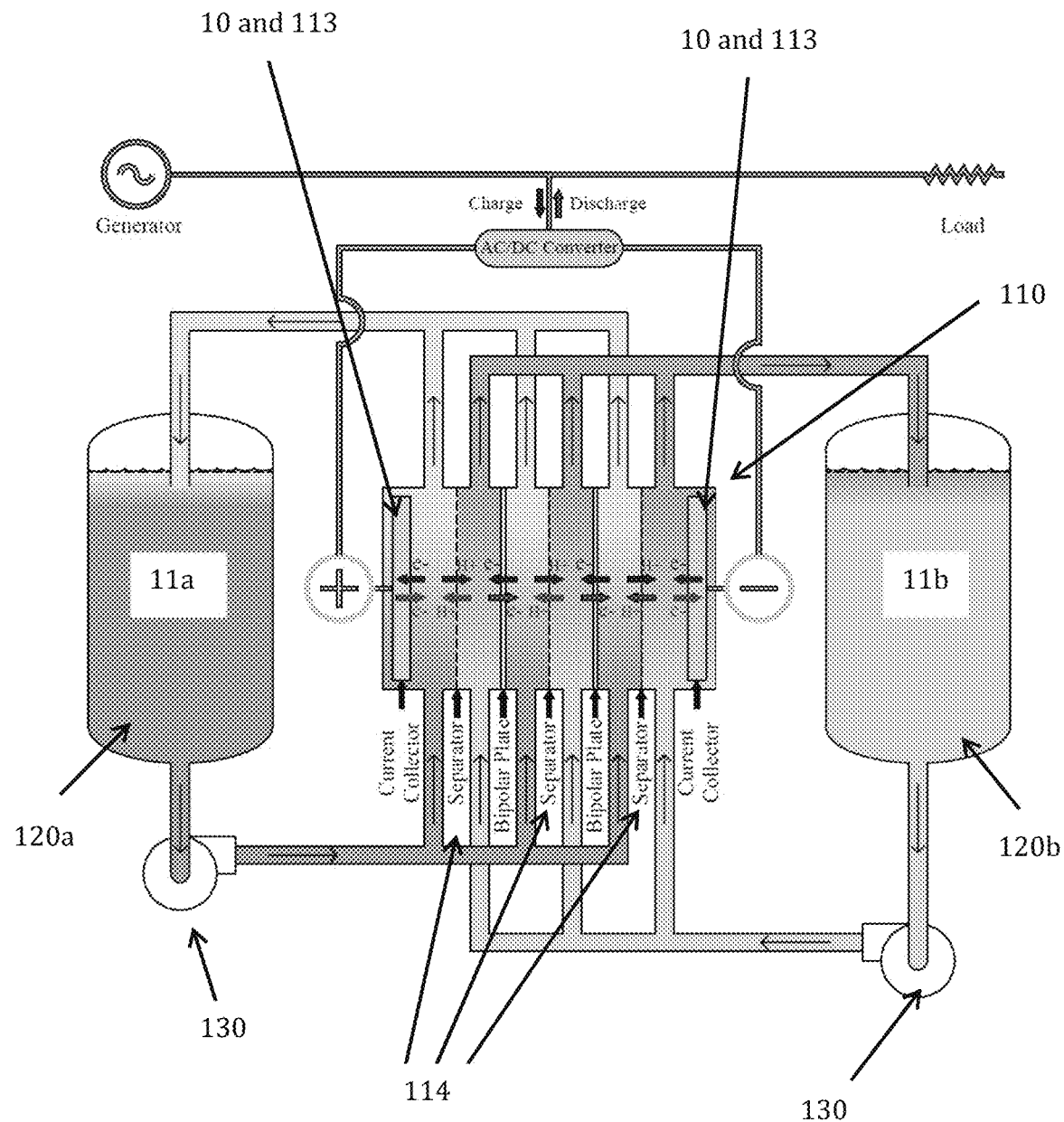

Referring to FIGS. 14A-14B, in some embodiments, the electrode 10 may be used to increase the coulombic efficiency of a fully rechargeable electrical energy storage system 100. The rechargeable electrical energy storage system 100 may be configured as a redox single cell flow system (see FIG. 14A) or a multi-cell flow system 100 (see FIG. 14B). Note that the multi-cell flow system 100 shown in FIG. 14B is connected to an electrical load. Catholyte electrolyte fluid 11a and anolyte electrolyte fluid 11b may be pumped from their respective storage tanks 120a, 120b through electrodes 10 in an electrochemical cell 112 compartment and further through a separator membrane 114. The electrodes 10 may be porous. Examples of electrolytes 11 that may be used with the system 100 can include an all-quinone electrolyte or an all-vanadium electrolyte. Redox reactions occurring on both sides of the separator membrane 114 can promote an electrical potential in the electrochemical cell 112. This may drive an electrical current external to the battery electrochemical cell 112. In the exemplary multi-cell system of FIG. 14B, the plurality of electrochemical cells 112 may be arranged in electrical series, which may facilitate building electrical potential. In some embodiments, the plurality of electrochemical cells 112 may be arranged as a cell stack 110. In at least one embodiment, the flow of electrolyte 11 though the electrochemical cells 112 of the cell stack 110 can be by a parallel arrangement into and out of the cell stack 110, as dictated by a manifold.

Any of the electrodes of any of the various flow battery systems 100 may be constructed as any of the electrode embodiments described herein. This may include an electrode 10 with a rigid core. The rigid core configuration may facilitate static mixing of the electrolyte 10. The electrode composite material may further include a flexible conforming outer cover that can be structured to contact both the separator membrane 114 and the current collector 113. The rigid core may be made by additive manufacturing processes. For example, the rigid core may be carbon foam 32 formed by additive manufacturing and the outer cover may be carbon felt 30. Any of the carbon foam 32 and carbon felt 30 layers may include a flow channel 12. Alternatively, or in addition, any of the rigid cores of an electrode 10 may be constructed of reticulated foam. In at least one embodiment, Inconel® 625 alloy can be used to fabricate an electrode body 10 via additive manufacturing techniques, which may include using Inconel® 625 alloy to fabricate the rigid core of the electrode 10. Some embodiments may include use of graphite-loaded-polylactic acid (PLA) polymer. In addition, the electrodes 10 of any of the flow battery systems 100 may include any of the flow channels 12 described herein.

In some embodiments, the electrode 10 can be configured to mix electrolyte 11 at the interface existing between the electrode 10 and the separator membrane 114. The electrode 10 can be further configured to direct the electrolyte 11 towards the interfaces existing between the separator membrane 114 and/or the current collector 113. It should be noted that spatial distribution of current and species may be most concentrated at these interfaces. This may facilitate improved electron exchange between a surface of the electrode 10 and the electrolyte 11.

Figure 15A:
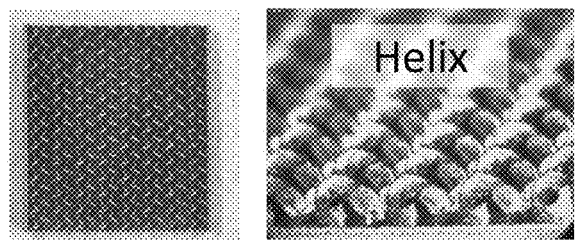
FIG. 15A shows an embodiment of an electrode formed via additive manufacturing having helical-shaped flow channels.
Figure 15B:
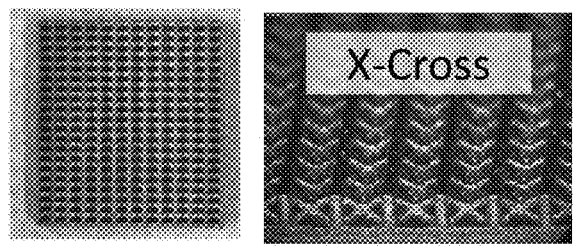
FIG. 15B shows an embodiment of an electrode formed via additive manufacturing having X-cross-shaped flow channels.
Figure 15C:
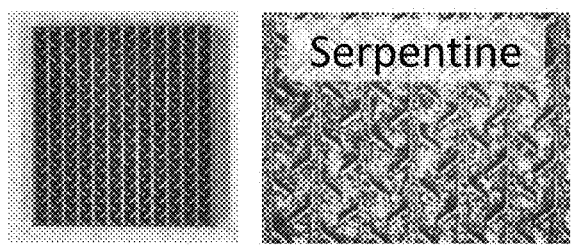
FIG. 15C shows an embodiment of an electrode formed via additive manufacturing having serpentine-shaped flow channels.
Figure 15D:
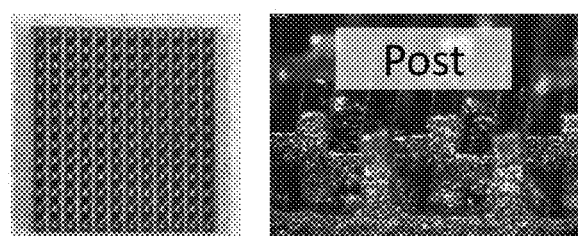
FIG. 15D shows an embodiment of an electrode formed via additive manufacturing having post type-shaped flow channels.

FIGS. 15A-15D show exemplary electrode 10 configurations that may be formed for use with any of the flow battery systems 100 described herein. FIG. 15A shows an electrode 10 formed via additive manufacturing having helical-shaped flow channels 12 formed on a surface of the electrode 10. FIG. 15B shows an electrode 10 formed via additive manufacturing having X-cross-shaped flow channels 12 formed on a surface of the electrode 10. FIG. 15C shows an electrode 10 formed via additive manufacturing having serpentine-shaped flow channels 12 formed on a surface of the electrode 10. FIG. 15D shows an electrode 10 formed via additive manufacturing having post type-shaped flow channels 12 formed on a surface of the electrode 10.

Figure 16:
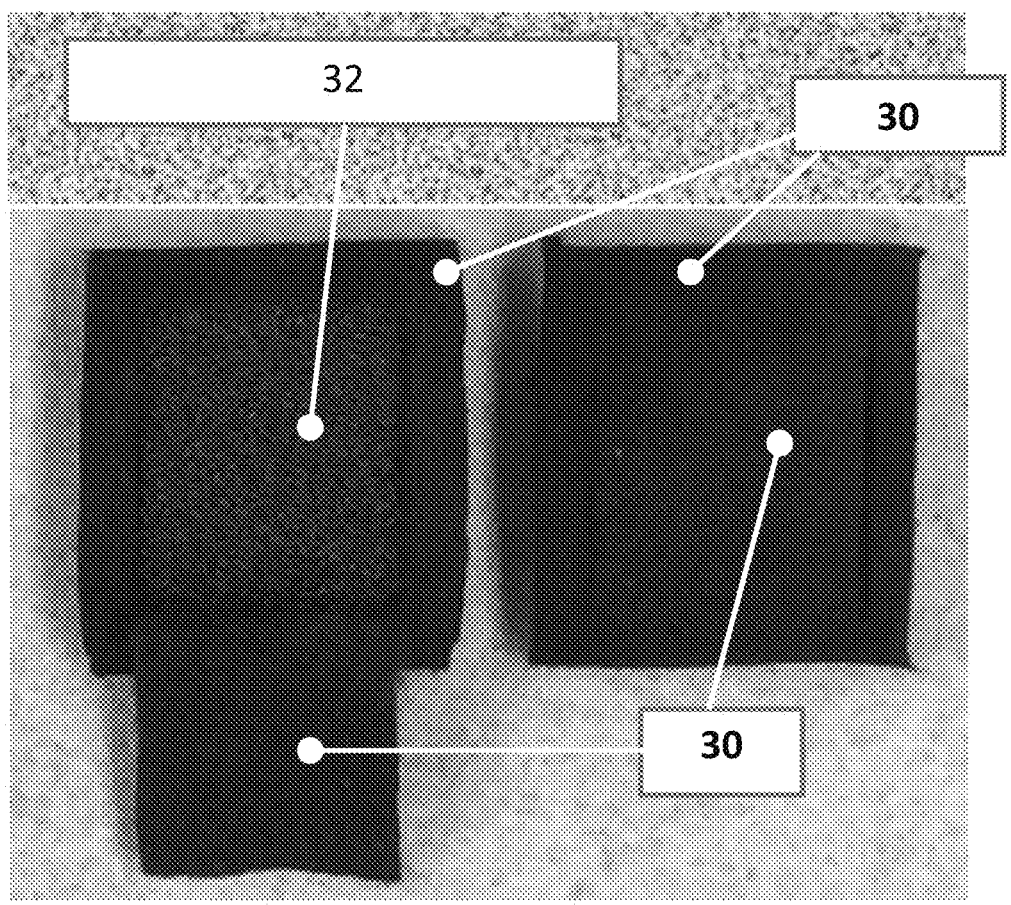
FIG. 16 shows exemplary embodiments of an electrode having a carbon foam core and a felt outer shell.

Any of the electrode 10 configurations of FIGS. 15A-15D can also include an all carbon felt construction and/or a carbon felt/foam material configuration. For example, the carbon felt/foam electrode 10 may contain a rigid carbon foam core 32 and compressible carbon felt outer shell 30. The carbon felt/foam electrode 10 may exhibit a similar or better voltaic efficiency as compared to an all-carbon felt electrode 10. As see in FIG. 16, the plan view area of the felt 30 and the foam 32 may be made to be equivalent, which may facilitate a lower liquid flow pressure drop within the flow battery system 100.

Any one of the felt layer 30 and the foam layer 32 can be thermally treated in a muffle furnace at atmospheric conditions. Examples of carbon felt material 30 can include The Carbon Company's ("SGL Group") SIGRACELL® GFA6 felt and SIGRACELL® KFD2.5 felt. The felt 30 can then be heated to 400° C. for 24 hours. An example of carbon foam 32 material includes KR Reynolds Company RVC80-125-44. The carbon foam 32 can be heated to 305° C. for 24 hours. The disparate temperature settings between felt 30 and foam 32 may require separate heat treatments for each of the felt 30 and foam 32 due to the lower temperature limit of the foam material 32. For example, the temperature limit of KR Reynolds Company RVC80-125-44 foam is 315° C. Subjecting it to greater temperatures may cause it to thin, distort, and/or ash. The temperature limit for the carbon felts 30 disclosed above are up to 1,000° C. An analysis may be performed to determine whether a beneficial effect can be obtained from an electrode 11 thermal treatment. For example, thermal treatment of an electrode 11 may improve efficient function of the flow battery system 100, which may further depend on the catholyte fluid 11a composition and/or the anolyte fluid 11b composition. In some embodiments, only one electrode 10 may use felt 30 that has been thermally treated. For example, where all-vanadium electrolyte 11 is used only the anodic (valance of three, V3+, to a valence of two, V2+) compartment of the flow battery system 100 may be equipped with an electrode 10 having thermally treated felt 30, where the electrodes 10 on the cathodic side may not be thermally treated.

Figure 17:
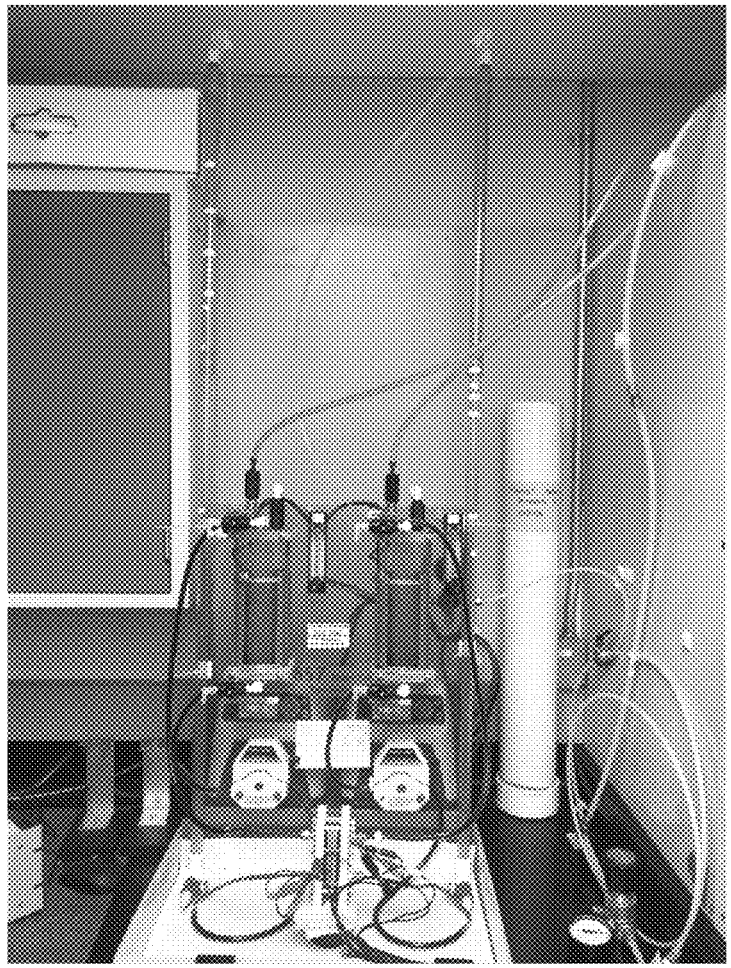
FIG. 17 shows a Bench-scale Redox Flow Battery ("RFB") Test System with Water Column Standpipe that may be used to test and validate embodiments of an electrode.

Embodiments of the exemplary electrodes 10 may be tested on a bench-scale Redox Flow Battery ("RFB"). Both quinone and vanadium electrolytes may be used. In all testing, all the electrodes 10 having additive manufactured cores and with foam cores showed pressure drops (ΔP) lower than all felt electrodes. Initially, ΔP was measured with 0-60 inches of water column ("H₂O") gauges. The pressure-indicating instrument may be changed to an actual water column (see FIG. 17), which may provide for higher precision and accuracy.

Figure 18:
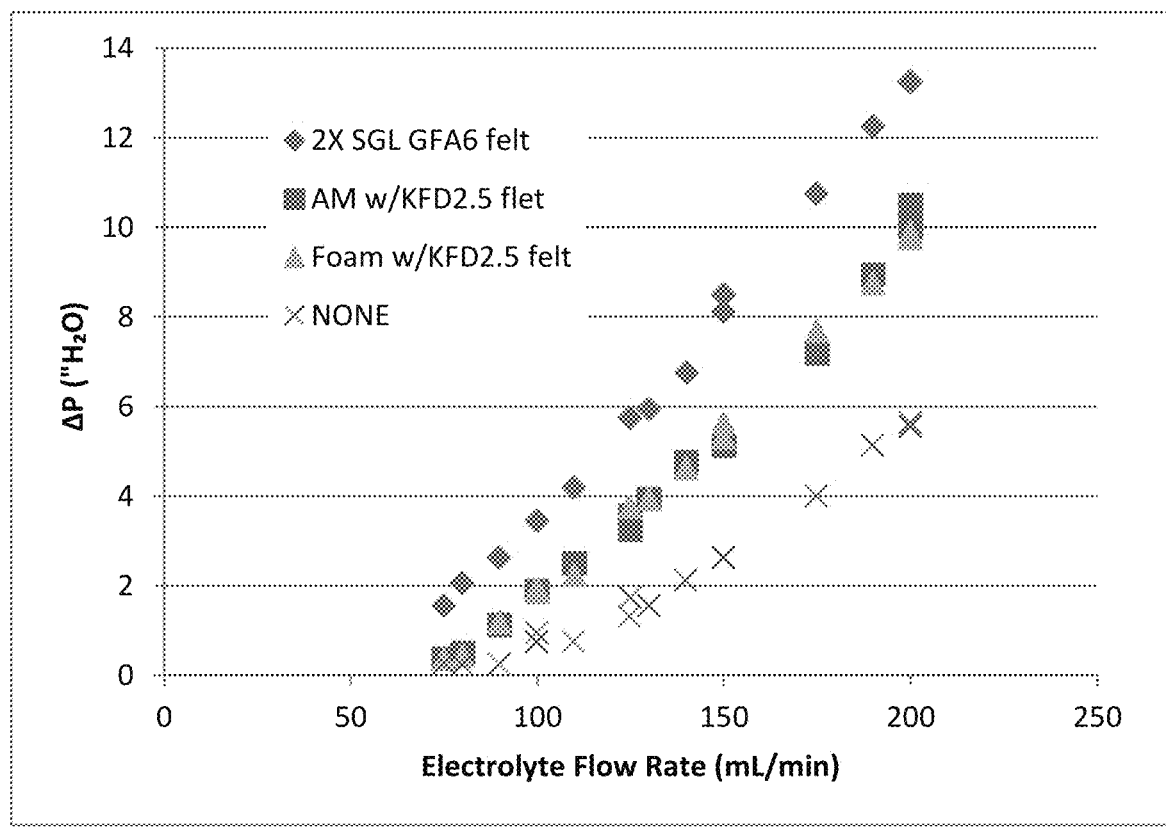
FIG. 18 shows a comparison of pressure drop versus flow when using the RFB Test System of FIG. 17 for various electrode configurations of the present invention.

During testing, water may be circulated through the RFB Test System. The two standpipes shown in FIG. 17 can be connected to the feed sides of each flow battery half-cell, which may facilitate measuring the backpressure from the electrolyte tank 120 feed pump 130. The vent side of the standpipe can be routed to the vapor space of the electrolyte tank 120, which may facilitate measuring the electrolyte tank's 120 gas blanket pressure. Such a configuration may allow the standpipes to measure more accurately the ΔP between (1) the electrolyte 11 feed to the battery compartment and (2) the electrolyte 11 discharge to the top of the tank 120. The ΔP without the electrode 10 can be measured to account for system ΔP when none of the electrodes 10 are present in the compartments. FIG. 18 shows the results comparing pressure drop (in inches of water column, "H₂O") by RFB tested electrodes 10 (7 millimeter, mm thick) versus flow rate (in milliliters per minute, mL/min). When discounting the system ΔP, the ΔP for electrodes 10 with a porous core were approximately 50% lower than the all-felt electrode ("2×SGL GFA6") in this compartment thickness. The test was conducted in the configuration that accommodated the electrode with the additive manufactured PLA core. In this configuration, the RFB cell compartments were 7 mm, providing less ΔP than the more confining standard RFB cell compartments of 4 mm. When ΔP of flow through the standard 4-mm RFB cell compartment was measured (with pressure gauges), the results (see Table 1) were more significant between the additive manufactured electrodes 10 and the all-felt electrodes.

TABLE 1

Comparison of Pressure Drop by RFB Electrodes versus Flow Rate

| Flow rate | Pressure Drop ("H₂O") | | | | |
|---|---|---|---|---|---|
| (mL/min) | All-Felt | Helix | Serpentine | X-Cross | Post |
| 40 | 7.0 | 2.0 | 3.0 | 3.0 | 1.5 |
| 50 | 7.0 | 2.0 | 3.0 | 3.0 | 1.5 |
| 60 | 7.0 | 2.5 | 3.0 | 3.0 | 1.5 |
| 70 | 7.5 | 2.5 | 3.0 | 3.5 | 2.0 |
| 80 | 7.5 | 2.5 | 3.0 | 3.5 | 2.0 |
| 90 | 7.5 | 2.5 | 3.5 | 3.5 | 2.0 |
| 100 | 7.5 | 2.5 | 3.5 | 3.5 | 2.0 |

The measurements indicate that the additive manufactured electrode 10 having post-type flow channels within the core had the lowest ΔP in the standard 4-mm-thick compartment 12, and that it was approximately 75% less than that of the all-felt electrode 10. This difference is magnified when considering both that the linear travel through a full-scaled RFB is almost 20 times larger than the linear path through a bench-scale RFB, and that the viscosity of the all-vanadium electrolyte 11 is approximately five times that of water—Darcy's law shows that multiplying the two factors of the full-scaled RFB unit will result in a ΔP increase factor of 100 for scale-up.

Figure 19:
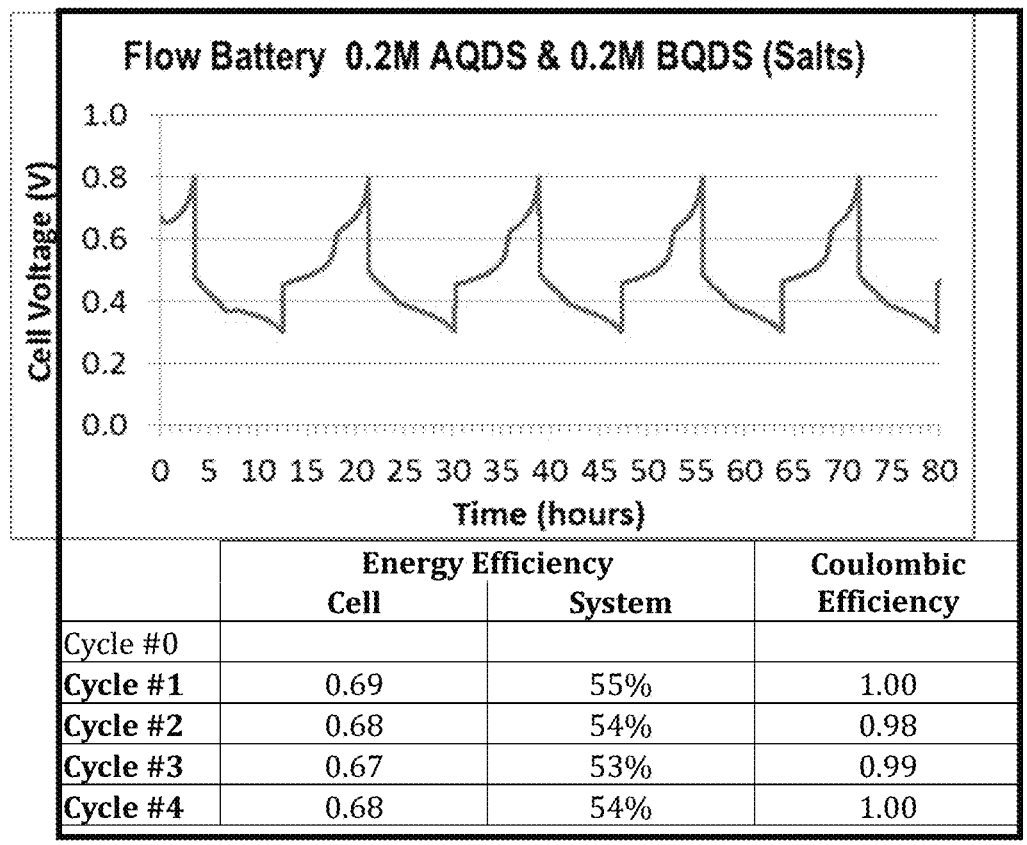
FIG. 19 shows time versus cell voltage characteristics of a battery flow system when exemplary electrodes are used as part of the electrochemical cells of the system.

RFB energy efficiency testing can be conducted using a Micro Flow Cell with a 10 cm² membrane area. During the test, the cell thickness was 4 mm with a 0.33 cm flow path height. The quinone-based electrolytes 11 used for the single-cell assembly test contained 1,2-benzoquinone-3,5-disulfonic acid ("BQDS") on the positive battery cell (cathode), and anthraquinone-2,7-sulfonic acid ("AQDS") in the negative battery cell (anode). Both of these quinones were in the sodium salt form, as received from Sigma Aldrich, dissolved to 0.2 molar (M) concentration, in 1 M sulfuric acid ($H_2SO_4$). The battery charge/discharge cycled five times, with the first cycle used to set the state of charge for the subsequent cycles, and not used in the performance analysis. Results for electrode 11 with the foam core 32 and the quinone-based electrolyte 11 are shown in FIG. 19. The mean of four cycles of cell energy efficiency was 68%, which is better (higher) than the cell energy efficiency of 60% with the all-felt electrode.

Some embodiments can include electrophoretically coating the electrode core 32 with graphene. This may be done to increase the electrical conductivity of the electrode 10. This may further increase the electrical conductivity while still allowing the electrode 10 to be compatible with a corrosive electrolyte 11. For example, a pretreated Inconel 625 plate can be anodically coated with graphene oxide from a 1 milligram graphene oxide/Liter of $H_2O$, at 1 Volt for 1 minute. The graphene oxide coating can then be thermally reduced to a graphene coating in a muffle furnace at 600° C. inert gas for 1 minute. In the alternative, copper coupons, which may include a very electrically conductive base material, may be used. These may allow for more uniform coating and resistance to corroding the base metal.

Figure 20:
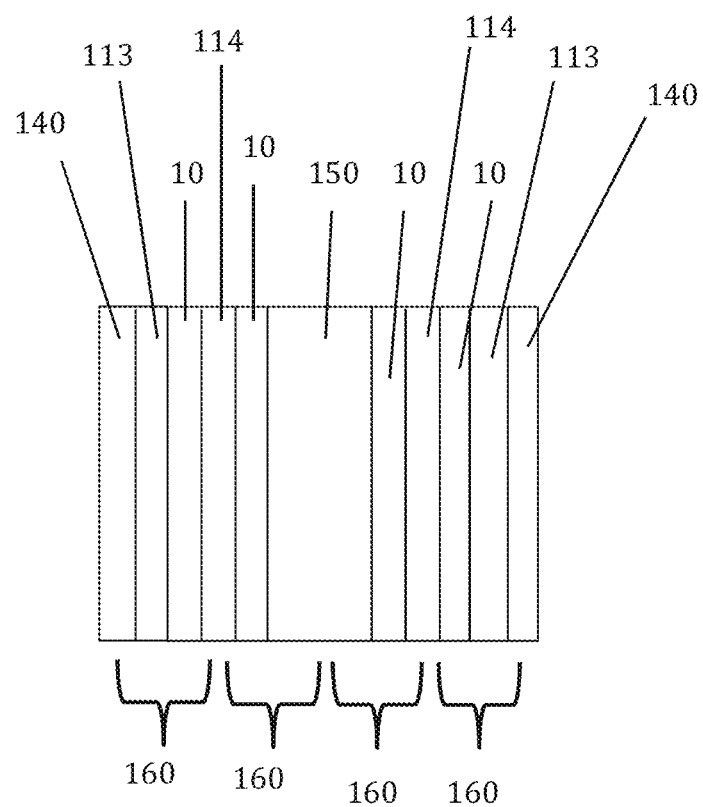
FIG. 20 shows a schematic of an exemplary multi-electrochemical cell system that may be formed by using an embodiment of the electrode body.

Referring to FIG. 20, in flow battery systems 100 with multiple electrochemical cells 112, a plurality of electrochemical cells 112 can be arranged in electrical series. Each electrochemical cell 112 may be separated by a bipolar plate 150 to facilitate passage of electricity while keeping the electrolyte 11 inside. The bipolar plate 150 can be fabricated via additive manufacturing methods and may include materials such as metal, graphite, carbon polymer, etc. In some embodiments, the bipolar plate 150 can be used to generate a flow sub-compartment 160. With multiple bipolar plates 150, a plurality of flow sub-compartments 160 can be formed, each flow sub-compartment 160 having an opposite polarity. Each flow sub-compartment 160 can also contain an electrode 10 of a respective polarity. Monopolar plates 140 may be placed at terminal ends of the electrochemical cell 112. The electrodes 10, monopolar plates 140, and bipolar plates 150 can be placed into electrical communication with the current collectors 113.

For example, FIG. 20 shows a schematic of an exemplary system 100 having multiple electrochemical cells 112 that may be formed by using an embodiment of the electrode body 10. As a non-limiting example, the electrochemical cell 112 can include a first monopolar plate 140 adjacent a first current collector 113. The first current collector 113 may be adjacent a first electrode 10. The first electrode 10 may be adjacent a first membrane 114. The first membrane 114 may be adjacent a second electrode 10. The second electrode 10 may be adjacent a bipolar plate 150. The bipolar plate 150 may be adjacent a third electrode 10. The third electrode 10 may be adjacent a second membrane 114. The second membrane 114 may be adjacent a fourth electrode 10. The fourth electrode 10 may be adjacent a second current collector 113. The second current collector 113 may be adjacent a second monopolar plate 140. The monopolar plates 140 may be structured as a frame to contain the current collectors 113, electrodes 10, bipolar plate 150, and membranes 114. The monopolar plates 140 of the frame may be secured together via a fastener, fused together, or otherwise sealed. Any of the monopolar plates 140 or other components can include inlets 117 and/or outlets 117 to allow electrolyte 11 to pass into and out from the chamber created between the monopolar plates 140. For example, the inlets 117 and/or outlets 117 can be configured to facilitate fluid communication with a manifold. The manifold can be in further fluid communication with electrolyte tanks 120a, 120b of a flow battery system 100. The system 100 shown in FIG. 20 is only one configuration of how a multiple electrochemical cell 112 system 100 may be generated.

Embodiments of the additive manufacturing techniques disclosed herein may also be used to generate a bipolar plate 150. The bipolar plate 150 may be used in an embodiment of a system 100 having a multiple electrochemical cell 112 configuration. In some embodiments, the bipolar plate 150 can include at least one embodiment of an electrode 10 disclosed herein. For example, a bipolar plate 150 can include at least one layer of carbon felt 30 and carbon foam 32. In some embodiments, additive manufacturing can be used to produce a member comprising a bipolar plate 150 and an embodiment of the electrode 10 as a unitary structure for use with an electrochemical cell 112. The additive manufactured bipolar plate 150 can include a bipolar plate 150 with an electrode 10 formed on at least one side of the bipolar plate 150. The electrode 10 can be configured as a negative electrode 10 and/or the positive electrode 10. The additive manufactured bipolar plate 150 can further include a bipolar plate 150 with a first electrode 10 formed on a first side of the bipolar plate 150 and a second electrode 10 formed on a second side of the bipolar plate 150. The first electrode 10 can be configured as the negative electrode 10. The second electrode 10 can be configured as the positive electrode 10. A single unitary bipolar plate/electrode 150, 10 member may avoid junction-to-junction resistive losses between parts that may otherwise occur with a non-unitary structure. This may improve the electrical continuity for efficient electron transfer, which may provide for low electrical resistance. This may also ease component registration for assembly of a battery stack 110.

It will be apparent to those skilled in the art that numerous modifications and variations of the described examples and embodiments are possible in light of the above teachings of the disclosure. The disclosed examples and embodiments are presented for purposes of illustration only. Other alternative embodiments may include some or all of the features of the various embodiments disclosed herein. Therefore, it is the intent to cover all such modifications and alternative embodiments as may come within the true scope of this invention, which is to be given the full breadth thereof. Additionally, the disclosure of a range of values is a disclosure of every numerical value within that range, including the end points.

What is claimed is:

1. An electrode body within an electrolyte environment, the electrode body comprising:
   a transport medium having a first surface and a second surface, the transport medium comprising:
      a plurality of flow channels, the plurality of flow channels being formed by any one or combination of formed on the first surface, formed on the second surface, or formed within a portion of the transport medium;
      wherein each flow channel forms a first electrolyte pathway and a second electrolyte pathway, wherein the first electrolyte pathway and the second electrolyte pathway are configured to receive electrolyte and cause electrolyte flowing through the first electrolyte pathway to cross into electrolyte flowing through the second electrolyte pathway, resulting in turbulent electrolyte flow within each flow channel;
      wherein each flow channel has a shape including:
         helical, forming first and second helical electrolyte pathways;
         X-cross, forming first and second X-cross electrolyte pathways; or
         post-type, forming first and second post-type electrolyte pathways;
      wherein the first and second electrolyte pathways provide a conduit for electrolyte to flow through so that electrolyte flows as a fluid column within each flow channel.

2. The electrode body recited in claim 1, wherein the first and second electrolyte pathways of each flow channel further generates any one or combination of turbulent electrolyte flow, chaotic electrolyte flow, or periodic electrolyte flow.

3. The electrode body recited in claim 1, wherein the first and second electrolyte pathways of each flow channel increases contact-time with which electrolyte makes with the transport medium when flowing through each flow channel.

4. The electrode body recited in claim 1, wherein the first and second electrolyte pathways of each flow channel increases surface-contact with which the electrolyte makes with the transport medium when flowing through each flow channel.

5. The electrode body recited in claim 2, wherein any one or combination of the first electrolyte pathway crossing into the second electrolyte pathway, the turbulent electrolyte flow, the chaotic electrolyte flow, or the periodic electrolyte flow perturbs a boundary layer of the electrolyte to cause an increase in active electrolyte molecule gradient, wherein the increase in active electrolyte molecule gradient facilitates an increase in charge transfer or an increase in a rate of charge transfer from the electrolyte to the transport medium.

6. The electrode body recited in claim 1, wherein the transport medium is made via additive manufacturing techniques.

7. The electrode body recited in claim 1, wherein the transport medium comprises rigid core and a flexible, compressible outer shell.

8. The electrode body recited in claim 7, wherein the rigid core comprises carbon foam and the outer shell comprises carbon felt.

9. The electrode body recited in claim 7, wherein at least the rigid core is fabricated via additive manufacturing techniques.

10. The electrode body recited in claim 7, wherein the plurality of flow channels is any one or combination of formed on the rigid core or formed within a portion of the rigid core.

11. An electrode within an electrolyte environment, the electrode comprising:
   an electrode body comprising:
      a rigid core having a plurality of flow channels that is any one or combination of: formed on the rigid core or within a portion of the rigid core, the rigid core comprising carbon foam; and
      an outer shell disposed on the rigid core, the outer shell comprising carbon felt, wherein the carbon foam provides a low-pressure path to supply electrolyte to the outer shell when electrolyte is caused to flow through the electrode body, and the carbon felt provides a reaction zone for the electrode body, and
      wherein each flow channel forms a first electrolyte pathway and a second electrolyte pathway, wherein the first electrolyte pathway and the second electrolyte pathway are configured to receive electrolyte and cause electrolyte flowing through the first electrolyte pathway to cross into electrolyte flowing through the second electrolyte pathway, resulting in turbulent electrolyte flow within each flow channel;
   wherein each flow channel has a shape including:
      helical, forming first and second helical electrolyte pathways;
      X-cross, forming first and second X-cross electrolyte pathways; or
      post-type, forming first and second post-type electrolyte pathways;
   wherein the first and second electrolyte pathway provide a conduit for electrolyte to flow through so that electrolyte flows as a fluid column within each flow channel.

12. The electrode recited in claim 11, wherein the rigid core is fabricated via additive manufacturing techniques.

13. An electrochemical cell comprising at least one electrode of claim 12.

14. A plate for separating adjacent battery cells in a battery stack, comprising:
   a bipolar plate having a first electrode for a catholyte formed on one side of the bipolar plate, and a second electrode for an anolyte formed on an opposite side of the bipolar plate, wherein the bipolar plate and the first and second electrodes are formed as a unitary member via additive manufacturing techniques, wherein any one or combination of the first electrode or the second electrode is an electrode recited in claim 11.

15. The bipolar plate recited in claim 14, wherein the first electrode is a positive electrode and the second electrode is a negative electrode.

* * * * *